United States Patent
Bhat et al.

(10) Patent No.: US 10,842,016 B2
(45) Date of Patent: Nov. 17, 2020

(54) COMPACT OPTICALLY EFFICIENT SOLID STATE LIGHT SOURCE WITH INTEGRATED THERMAL MANAGEMENT

(75) Inventors: Chandan Bhat, Goleta, CA (US); Theodore Douglas Lowes, Lompoc, CA (US); Julio Garceran, Cary, NC (US); Bernd Keller, Santa Barbara, CA (US)

(73) Assignee: Cree, Inc., Durham, NC (US)

(*) Notice: Subject to any disclaimer, the term of this patent is extended or adjusted under 35 U.S.C. 154(b) by 0 days.

(21) Appl. No.: 13/177,415

(22) Filed: Jul. 6, 2011

(65) Prior Publication Data
US 2013/0009179 A1   Jan. 10, 2013

(51) Int. Cl.
| | | |
|---|---|---|
| *H01L 33/60* | (2010.01) | |
| *H05K 1/02* | (2006.01) | |
| *H05K 1/03* | (2006.01) | |
| *F21V 19/00* | (2006.01) | |
| *F21Y 105/12* | (2016.01) | |

(Continued)

(52) U.S. Cl.
CPC ........ *H05K 1/0209* (2013.01); *F21V 19/0055* (2013.01); *F21Y 2105/10* (2016.08); *F21Y 2105/12* (2016.08); *F21Y 2115/10* (2016.08); *H01L 2224/32245* (2013.01); *H01L 2224/32257* (2013.01); *H01L 2224/48091* (2013.01); *H01L 2224/48247* (2013.01); *H01L 2224/73265* (2013.01); *H05K 1/0373* (2013.01);

(Continued)

(58) Field of Classification Search
USPC .......................... 438/22–30, 34; 257/79–99, 257/E33.056–E33.059
See application file for complete search history.

(56) References Cited

U.S. PATENT DOCUMENTS

| | | | |
|---|---|---|---|
| 3,674,990 A | 7/1972 | Kurauchi et al. | 235/462.16 |
| 3,900,863 A | 8/1975 | Kim | 257/95 |

(Continued)

FOREIGN PATENT DOCUMENTS

| | | |
|---|---|---|
| CN | 1406450 A | 3/2003 |
| CN | 1460393 | 12/2003 |

(Continued)

OTHER PUBLICATIONS

XLamp® LED's, CREE product info pp. 1-3.
(Continued)

*Primary Examiner* — Abul Kalam
(74) *Attorney, Agent, or Firm* — Ferguson Case Orr Paterson LLP

(57) ABSTRACT

A compact and efficient LED array lighting component comprising a circuit board with an array of LED chips mounted on it and electrically interconnected. A plurality of primary lenses is included, each of which is formed directly over each LED chip and/or a sub-group of the LED chips. A heat sink is included with the circuit board mounted to the heat sink so that heat from the LED chips spreads into the heat sink. In some embodiments the circuit board can be thermally conductive and electrically insulating. Method of forming an LED component are also disclosed utilizing chip-on-board mounting techniques for mounting the LED chips on the circuit board, and molding of the primary lenses directly over the LED chips individually or in sub-groups of LED chips.

16 Claims, 10 Drawing Sheets

(51) Int. Cl.
*F21Y 105/10* (2016.01)
*F21Y 115/10* (2016.01)

(52) U.S. Cl.
CPC ............... *H05K 2201/066* (2013.01); *H05K 2201/10106* (2013.01)

(56) References Cited

U.S. PATENT DOCUMENTS

| | | | |
|---|---|---|---|
| 4,322,735 A | 3/1982 | Sadamasa et al. | 257/89 |
| 4,500,914 A | 2/1985 | Watanabe et al. | 348/280 |
| 4,946,547 A | 8/1990 | Palmour et al. | |
| 4,992,704 A | 2/1991 | Stinson | 315/312 |
| 5,184,114 A | 2/1993 | Brown | 345/83 |
| 5,200,022 A | 4/1993 | Kong et al. | |
| 5,278,432 A | 1/1994 | Ignatius et al. | 257/88 |
| RE34,861 E | 2/1995 | Davis et al. | |
| 5,453,405 A | 9/1995 | Fan et al. | 438/34 |
| 5,578,998 A | 11/1996 | Kasprowicz | 340/642 |
| 5,643,834 A | 7/1997 | Harada et al. | 438/122 |
| 5,766,987 A | 6/1998 | Mitchell et al. | 438/126 |
| 5,924,785 A | 7/1999 | Zhang et al. | 362/241 |
| 5,946,022 A | 8/1999 | Kamimura | 347/236 |
| 5,990,497 A | 11/1999 | Kamakura et al. | |
| 6,093,940 A | 7/2000 | Ishinaga et al. | 257/49 |
| 6,149,283 A | 11/2000 | Conway et al. | 362/236 |
| 6,153,448 A | 11/2000 | Takahashi | 438/114 |
| 6,224,216 B1 | 5/2001 | Parker et al. | 353/31 |
| 6,297,598 B1 | 10/2001 | Wang et al. | 315/169.3 |
| 6,422,716 B2 | 7/2002 | Henrici et al. | 362/235 |
| 6,452,217 B1 | 9/2002 | Wojnarowski et al. | 257/99 |
| 6,476,410 B2 | 11/2002 | Ishinaga | 257/13 |
| 6,498,355 B1 | 12/2002 | Harrah et al. | 257/99 |
| 6,501,084 B1 | 12/2002 | Sakai et al. | 250/504 R |
| 6,501,100 B1 | 12/2002 | Srivastava | |
| 6,522,065 B1 | 2/2003 | Srivastava | |
| 6,573,537 B1 | 6/2003 | Steigerwald et al. | 257/103 |
| 6,577,073 B2 | 6/2003 | Shimizu et al. | |
| 6,617,795 B2 | 9/2003 | Bruning | 315/151 |
| 6,637,921 B2 | 10/2003 | Coushaine | 362/517 |
| 6,653,765 B1 | 11/2003 | Levinson | |
| 6,661,029 B1 | 12/2003 | Duggal | 257/89 |
| 6,672,741 B1 | 1/2004 | Young | 362/311 |
| 6,722,777 B2 | 4/2004 | Erber | 362/518 |
| 6,739,735 B2 | 5/2004 | Talamo et al. | 362/237 |
| 6,767,112 B2 | 7/2004 | Wu | 362/247 |
| 6,791,259 B1 | 9/2004 | Stokes | |
| 6,803,732 B2 | 10/2004 | Kraus et al. | 315/307 |
| 6,811,277 B2 | 11/2004 | Amano | 362/31 |
| 6,846,101 B2 | 1/2005 | Coushaine | 362/517 |
| 6,891,200 B2 | 5/2005 | Nagai et al. | 257/88 |
| 6,893,140 B2 | 5/2005 | Storey et al. | 362/191 |
| 6,899,443 B2 | 5/2005 | Rizkin et al. | 362/327 |
| 6,909,123 B2 | 6/2005 | Hayashimoto et al. | 257/98 |
| 6,939,481 B2 | 9/2005 | Srivastava | |
| 6,948,825 B2 | 9/2005 | Christoph | 362/33 |
| 7,001,047 B2 | 2/2006 | Holder et al. | 362/296 |
| 7,002,546 B1 | 2/2006 | Stuppi et al. | 345/102 |
| 7,008,080 B2 | 3/2006 | Bachl et al. | 362/237 |
| 7,015,512 B2 | 3/2006 | Park et al. | 257/99 |
| 7,023,019 B2 | 4/2006 | Maeda et al. | 257/89 |
| 7,029,150 B2 | 4/2006 | Finch | 362/298 |
| 7,055,987 B2 | 6/2006 | Staufert | 362/235 |
| 7,095,053 B2 | 8/2006 | Mazzochette et al. | 257/81 |
| 7,097,334 B2 | 8/2006 | Ishida et al. | 362/516 |
| 7,121,691 B2 | 10/2006 | Coushine et al. | 362/298 |
| 7,131,760 B2 | 11/2006 | Mayer et al. | 362/555 |
| 7,176,503 B2 | 2/2007 | Kim et al. | 257/100 |
| 7,178,937 B2 | 2/2007 | McDermott | 362/187 |
| 7,204,607 B2 | 4/2007 | Yano et al. | 362/231 |
| 7,213,940 B1 | 5/2007 | Van de Ven et al. | |
| 7,230,280 B2 | 6/2007 | Yaw et al. | 257/98 |
| 7,246,921 B2 | 7/2007 | Jacobson et al. | 362/294 |
| 7,252,408 B2 | 8/2007 | Mazzochette et al. | 362/294 |
| 7,259,400 B1 | 8/2007 | Taskar | 257/98 |
| 7,262,437 B2 | 8/2007 | Bogner et al. | 257/95 |
| 7,270,448 B1 | 9/2007 | Maley, Sr. | 362/334 |
| 7,278,755 B2 | 10/2007 | Inamoto | 362/240 |
| 7,286,296 B2 | 10/2007 | Chaves et al. | 359/641 |
| 7,355,562 B2 | 4/2008 | Schubert et al. | 345/1.3 |
| 7,381,995 B2 | 6/2008 | Tain et al. | |
| 7,387,421 B2 | 6/2008 | Lee et al. | 362/612 |
| 7,439,549 B2 | 10/2008 | Marchl et al. | 257/88 |
| 7,478,922 B2 | 1/2009 | Garbus, Jr. | 362/231 |
| 7,528,421 B2 | 5/2009 | Mazzochette | 257/99 |
| 7,601,550 B2 | 10/2009 | Bogner | |
| 7,605,452 B2 | 10/2009 | Yamanaka et al. | 257/676 |
| 7,621,655 B2 | 11/2009 | Roberts et al. | 362/249.02 |
| 7,665,861 B2 | 2/2010 | Blumel et al. | 362/249.02 |
| 7,700,964 B2 | 4/2010 | Morimoto et al. | 257/98 |
| 7,723,744 B2 | 5/2010 | Gillies et al. | 257/98 |
| 7,772,609 B2 | 8/2010 | Yan | |
| 7,821,023 B2 | 10/2010 | Yuan et al. | 257/98 |
| 7,829,899 B2 | 11/2010 | Hutchins | 257/79 |
| 7,897,980 B2 * | 3/2011 | Yuan et al. | 257/88 |
| 7,902,560 B2 | 3/2011 | Bierhuizen et al. | 257/82 |
| 7,993,036 B2 | 8/2011 | Holder | 362/311.02 |
| 8,022,626 B2 | 9/2011 | Hamby et al. | 313/512 |
| 8,035,603 B2 | 10/2011 | Furukawa et al. | 345/102 |
| 8,098,364 B2 | 1/2012 | Yu et al. | 355/55 |
| 8,272,757 B1 | 9/2012 | Fan et al. | 362/231 |
| 8,511,855 B2 | 8/2013 | Marchl et al. | |
| 2001/0032985 A1 | 10/2001 | Bhat | 257/88 |
| 2001/0033726 A1 | 10/2001 | Shie et al. | 385/133 |
| 2002/0001193 A1 | 1/2002 | Osawa | |
| 2002/0001869 A1 | 1/2002 | Fjelstad | |
| 2002/0029071 A1 | 3/2002 | Whitehurst | 607/88 |
| 2002/0070681 A1 | 6/2002 | Shimizu et al. | 315/246 |
| 2002/0093820 A1 | 7/2002 | Pederson | |
| 2002/0113246 A1 | 8/2002 | Nagai et al. | |
| 2002/0136025 A1 | 9/2002 | Zhang | |
| 2002/0153529 A1 | 10/2002 | Shie | 257/99 |
| 2002/0171089 A1 | 11/2002 | Okuyama et al. | 257/88 |
| 2002/0171090 A1 | 11/2002 | Oohata et al. | 257/88 |
| 2003/0053310 A1 | 3/2003 | Sommers et al. | |
| 2003/0058641 A1 | 3/2003 | Watanabe | |
| 2003/0063475 A1 | 4/2003 | Simmons | |
| 2003/0072153 A1 | 4/2003 | Matsui et al. | |
| 2003/0116769 A1 | 6/2003 | Song et al. | |
| 2003/0147055 A1 | 8/2003 | Yokoyama | |
| 2003/0171150 A1 | 9/2003 | Oki et al. | 463/51 |
| 2003/0189829 A1 | 10/2003 | Shimizu et al. | 362/240 |
| 2004/0026706 A1 | 2/2004 | Bogner et al. | 257/99 |
| 2004/0037076 A1 | 2/2004 | Katoh | 362/235 |
| 2004/0079957 A1 * | 4/2004 | Andrews | H01L 33/486 257/100 |
| 2004/0099874 A1 | 5/2004 | Chang et al. | 257/98 |
| 2004/0104391 A1 | 6/2004 | Maeda et al. | 257/79 |
| 2004/0135522 A1 | 7/2004 | Berman et al. | |
| 2004/0155565 A1 | 8/2004 | Holder et al. | |
| 2004/0184272 A1 | 9/2004 | Wright et al. | 362/373 |
| 2004/0188696 A1 | 9/2004 | Hsing Chen | 257/99 |
| 2004/0222433 A1 | 11/2004 | Mazzochette et al. | |
| 2004/0239242 A1 | 12/2004 | Mano et al. | |
| 2004/0245532 A1 | 12/2004 | Maeda et al. | 257/89 |
| 2004/0256626 A1 | 12/2004 | Wang | |
| 2004/0264193 A1 | 12/2004 | Okumura | |
| 2005/0057929 A1 | 3/2005 | Yano et al. | 362/240 |
| 2005/0073840 A1 | 4/2005 | Chou et al. | |
| 2005/0082475 A1 | 4/2005 | Doan | 250/307 |
| 2005/0093422 A1 | 5/2005 | Wang | |
| 2005/0093430 A1 | 5/2005 | Ibbetson et al. | 313/501 |
| 2005/0122018 A1 | 6/2005 | Morris | 313/46 |
| 2005/0122031 A1 | 6/2005 | Itai | |
| 2005/0141584 A1 | 6/2005 | Ohe et al. | 372/108 |
| 2005/0179041 A1 | 8/2005 | Harbers et al. | 257/80 |
| 2005/0225976 A1 | 10/2005 | Zampini et al. | |
| 2005/0247944 A1 | 11/2005 | Haque | 257/79 |
| 2005/0253151 A1 | 11/2005 | Sakai et al. | 257/79 |
| 2005/0276053 A1 | 12/2005 | Nortrup et al. | 362/294 |
| 2005/0286264 A1 | 12/2005 | Kim | |
| 2006/0006406 A1 | 1/2006 | Kim et al. | 257/100 |
| 2006/0017402 A1 | 1/2006 | McKinney et al. | |
| 2006/0039143 A1 | 2/2006 | Katoh et al. | 362/244 |
| 2006/0043406 A1 | 3/2006 | Tsubokura et al. | 257/99 |

(56) References Cited

U.S. PATENT DOCUMENTS

| | | |
|---|---|---|
| 2006/0049782 A1 | 3/2006 | Vornsand et al. |
| 2006/0102914 A1 | 5/2006 | Smits et al. ................ 257/98 |
| 2006/0105478 A1 | 5/2006 | Camras et al. ............... 438/22 |
| 2006/0105484 A1 | 5/2006 | Basin |
| 2006/0139580 A1 | 6/2006 | Conner ......................... 353/98 |
| 2006/0157721 A1 | 7/2006 | Tran et al. |
| 2006/0163589 A1 | 7/2006 | Fan et al. ..................... 257/88 |
| 2006/0180818 A1 | 8/2006 | Nagai et al. |
| 2006/0231852 A1 | 10/2006 | Kususe et al. ................ 257/99 |
| 2006/0258028 A1 | 11/2006 | Paolini et al. ................ 438/22 |
| 2006/0262524 A1 | 11/2006 | Kah, Jr. |
| 2006/0289878 A1 | 12/2006 | Brunner et al. .............. 257/89 |
| 2007/0013057 A1 | 1/2007 | Mazzochette |
| 2007/0030676 A1 | 2/2007 | Ichihara et al. |
| 2007/0046176 A1 | 3/2007 | Bukesov et al. ............. 313/496 |
| 2007/0109779 A1 | 5/2007 | Sekiguchi et al. |
| 2007/0115670 A1 | 5/2007 | Roberts et al. |
| 2007/0139920 A1 | 6/2007 | Van De Ven et al. ........ 362/235 |
| 2007/0158668 A1 | 7/2007 | Tarsa ............................ 257/79 |
| 2007/0189017 A1 | 8/2007 | Hofmann |
| 2007/0223219 A1 | 9/2007 | Medendorp, Jr. et al. |
| 2007/0228387 A1 | 10/2007 | Negley et al. |
| 2007/0247414 A1 | 10/2007 | Roberts ....................... 345/102 |
| 2007/0247855 A1 | 10/2007 | Yano |
| 2007/0252924 A1 | 11/2007 | Haga et al. .................. 349/68 |
| 2007/0257272 A1 | 11/2007 | Hutchins ..................... 257/98 |
| 2007/0267983 A1 | 11/2007 | Van De Ven et al. |
| 2007/0278503 A1 | 12/2007 | Van De Ven et al. |
| 2007/0278934 A1 | 12/2007 | Van de Ven et al. |
| 2007/0279903 A1 | 12/2007 | Negley et al. |
| 2007/0291467 A1 | 12/2007 | Nagai et al. .................. 362/84 |
| 2007/0295972 A1 | 12/2007 | Tsai et al. .................... 257/88 |
| 2007/0295975 A1 | 12/2007 | Omae ........................... 257/89 |
| 2008/0024696 A1 | 1/2008 | Arai et al. .................... 349/62 |
| 2008/0043444 A1 | 2/2008 | Hasegawa ..................... 361/717 |
| 2008/0074885 A1 | 3/2008 | Brands et al. |
| 2008/0084685 A1 | 4/2008 | Van De Ven et al. |
| 2008/0084701 A1 | 4/2008 | Van De Ven et al. |
| 2008/0100774 A1 | 5/2008 | Jeon et al. .................... 349/62 |
| 2008/0106895 A1 | 5/2008 | Van De Ven et al. ........ 362/231 |
| 2008/0106907 A1 | 5/2008 | Trott et al. |
| 2008/0112164 A1 | 5/2008 | Teshirogi ..................... 362/231 |
| 2008/0112168 A1 | 5/2008 | Pickard et al. |
| 2008/0128735 A1 | 6/2008 | Yoo |
| 2008/0130285 A1 | 6/2008 | Negley et al. |
| 2008/0137357 A1 | 6/2008 | Friedrichs et al. ............ 362/507 |
| 2008/0142816 A1 | 6/2008 | Bierhuizen et al. ............ 257/82 |
| 2008/0151527 A1 | 6/2008 | Ueno |
| 2008/0170396 A1* | 7/2008 | Yuan et al. .................... 362/244 |
| 2008/0173884 A1 | 7/2008 | Chitnis ........................... 438/22 |
| 2008/0174996 A1 | 7/2008 | Lu ................................ 362/235 |
| 2008/0179611 A1 | 7/2008 | Chitnis ......................... 257/98 |
| 2008/0186702 A1 | 8/2008 | Camras et al. ................ 362/231 |
| 2008/0203415 A1 | 8/2008 | Thompson et al. |
| 2008/0204366 A1 | 8/2008 | Kane et al. ..................... 345/44 |
| 2008/0225520 A1 | 9/2008 | Garbus ........................ 362/231 |
| 2008/0230790 A1 | 9/2008 | Seko |
| 2008/0232079 A1 | 9/2008 | Awazu ............................ 362/3 |
| 2008/0238335 A1 | 10/2008 | Lee |
| 2008/0239722 A1 | 10/2008 | Wilcox ......................... 362/268 |
| 2008/0278655 A1* | 11/2008 | Moon ............... G02F 1/133603 349/58 |
| 2008/0285268 A1 | 11/2008 | Oku et al. ..................... 362/231 |
| 2009/0008662 A1 | 1/2009 | Ashdown et al. |
| 2009/0050907 A1 | 2/2009 | Yuan et al. .................... 257/88 |
| 2009/0050908 A1 | 2/2009 | Yuan ............................. 257/88 |
| 2009/0108281 A1 | 4/2009 | Keller et al. .................. 257/98 |
| 2009/0160363 A1 | 6/2009 | Negley |
| 2009/0195189 A1 | 8/2009 | Zampini et al. |
| 2009/0201679 A1 | 8/2009 | Konaka ........................ 362/235 |
| 2009/0212717 A1 | 8/2009 | Trattler ........................ 315/297 |
| 2009/0231832 A1 | 9/2009 | Zukauskas et al. ........... 362/84 |
| 2009/0257240 A1 | 10/2009 | Koike .......................... 362/538 |
| 2009/0316073 A1 | 12/2009 | Chen et al. ................... 349/64 |
| 2010/0014290 A1 | 1/2010 | Wilcox ........................ 362/244 |
| 2010/0025700 A1 | 2/2010 | Jung et al. ..................... 257/89 |
| 2010/0046231 A1 | 2/2010 | Medinis ........................ 362/294 |
| 2010/0079059 A1 | 4/2010 | Roberts et al. |
| 2010/0103660 A1 | 4/2010 | Van De Ven ................. 362/231 |
| 2010/0149783 A1 | 6/2010 | Takenaka et al. .............. 362/84 |
| 2010/0302786 A1 | 12/2010 | Wilcox ......................... 362/327 |
| 2011/0001149 A1 | 1/2011 | Chan et al. |
| 2011/0037084 A1 | 2/2011 | Sekii ............................. 257/89 |
| 2011/0075428 A1 | 3/2011 | Chen ........................... 362/311.02 |
| 2011/0095311 A1 | 4/2011 | Marchl et al. |
| 2011/0133224 A1* | 6/2011 | Zoorob ............... H01L 25/0753 257/88 |
| 2011/0164425 A1 | 7/2011 | Chen ........................... 362/311.06 |
| 2011/0222280 A1* | 9/2011 | Kim ........................ H01L 33/58 362/235 |
| 2011/0242807 A1 | 10/2011 | Little, Jr. ...................... 362/235 |
| 2012/0075858 A1* | 3/2012 | Hsieh ................... F21K 9/1355 362/249.02 |
| 2012/0104426 A1* | 5/2012 | Chan .................. H01L 25/0753 257/89 |
| 2012/0134154 A1 | 5/2012 | Marchl et al. |
| 2013/0142712 A1 | 6/2013 | Nagayasu et al. ............. 372/36 |

FOREIGN PATENT DOCUMENTS

| | | |
|---|---|---|
| CN | 1470072 | 1/2004 |
| CN | 1470072 A | 1/2004 |
| CN | 1512601 A | 7/2004 |
| CN | 1641899 A | 7/2005 |
| CN | 1667845 A | 9/2005 |
| CN | 1910762 A | 2/2007 |
| CN | 1983590 A | 6/2007 |
| CN | 101217840 | 7/2008 |
| CN | 101253813 | 8/2008 |
| CN | 201119078 | 9/2008 |
| CN | 101288341 | 10/2008 |
| CN | 101271674 | 12/2010 |
| DE | 2315709 | 3/1973 |
| DE | 19848078 | 4/2000 |
| DE | 10353293 A1 | 6/2005 |
| DE | 102005059362 | 9/2006 |
| DE | 102005028403 | 12/2006 |
| EP | 0594427 | 4/1994 |
| EP | 2337072 A2 | 6/2011 |
| EP | 2341280 A2 | 7/2011 |
| JP | 6284942 | 5/1987 |
| JP | 03209781 | 9/1991 |
| JP | 0545812 | 6/1993 |
| JP | 09246602 | 9/1997 |
| JP | 10012915 | 1/1998 |
| JP | 10261821 | 9/1998 |
| JP | 2001000043 | 1/2001 |
| JP | 2001057446 | 2/2001 |
| JP | 2001351404 | 12/2001 |
| JP | 200293830 | 3/2002 |
| JP | 2002184207 | 6/2002 |
| JP | 2002184207 A | 6/2002 |
| JP | 2003168305 | 6/2003 |
| JP | 2003168305 A | 6/2003 |
| JP | 2003258011 | 9/2003 |
| JP | 2004095580 | 3/2004 |
| JP | 2004512687 | 4/2004 |
| JP | 2004266168 | 9/2004 |
| JP | 2005142311 | 6/2005 |
| JP | 2005158957 | 6/2005 |
| JP | 2005228695 | 8/2005 |
| JP | 2005228695 A | 8/2005 |
| JP | 2006019598 | 1/2006 |
| JP | 2006054329 | 2/2006 |
| JP | 2006054329 A | 2/2006 |
| JP | 2006114854 | 4/2006 |
| JP | 2006128512 | 5/2006 |
| JP | 2006173271 | 6/2006 |
| JP | 2006261039 | 9/2006 |
| JP | 2006261375 | 9/2006 |
| JP | 2006294898 | 10/2006 |
| JP | 2006344690 | 12/2006 |
| JP | 2007049172 | 2/2007 |

(56) References Cited

FOREIGN PATENT DOCUMENTS

| | | |
|---|---|---|
| JP | 200759260 | 3/2007 |
| JP | 2007059207 | 3/2007 |
| JP | 2007067103 | 3/2007 |
| JP | 2007112134 | 5/2007 |
| JP | 2007189239 | 7/2007 |
| JP | 2007519221 | 7/2007 |
| JP | 2007227679 | 9/2007 |
| JP | 2007251214 | 9/2007 |
| JP | 2007529105 | 10/2007 |
| JP | 2007324608 | 12/2007 |
| JP | 200810691 | 1/2008 |
| JP | 200928271 | 2/2008 |
| JP | 2008505433 | 2/2008 |
| JP | 2008123818 | 5/2008 |
| JP | 2008218486 | 9/2008 |
| JP | 2008252262 | 10/2008 |
| JP | 2010511978 | 4/2010 |
| JP | 2011521469 | 7/2011 |
| TW | 540163 | 7/2003 |
| TW | 540163 B | 7/2003 |
| TW | 200525775 | 8/2005 |
| TW | 200633265 | 9/2006 |
| TW | 200620718 | 10/2007 |
| TW | 200827618 | 7/2008 |
| TW | 1404226 | 8/2013 |
| WO | WO 02/33756 A1 | 4/2002 |
| WO | WO02097884 A1 | 12/2002 |
| WO | WO 03019072 | 3/2003 |
| WO | WO03019072 | 3/2003 |
| WO | WO2005013365 A2 | 7/2004 |
| WO | WO 2005/013365 A2 | 2/2005 |
| WO | WO2005013365 A2 | 2/2005 |
| WO | WO2006001221 | 1/2006 |
| WO | WO2006001221 A1 | 1/2006 |
| WO | WO2006016326 | 2/2006 |
| WO | WO2006068297 | 6/2006 |
| WO | WO2006068297 A1 | 6/2006 |
| WO | WO2006111805 | 10/2006 |
| WO | WO2006135005 | 12/2006 |
| WO | WO2007055455 | 5/2007 |
| WO | WO2007121486 A2 | 10/2007 |
| WO | WO2007126720 A2 | 11/2007 |
| WO | WO2006013800 | 2/2009 |
| WO | WO2009157999 A1 | 12/2009 |
| WO | WO2010015825 A1 | 2/2010 |
| WO | WO2010133772 | 11/2010 |

OTHER PUBLICATIONS

EZ LED Chip, CREE product info pp. 1-6.
Lamina, Titan Turbo LED Light Engines data sheet, 2008.
International Search Report and Written Opinion for counterpart PCT application No. PCT/US2010/003168 dated Apr. 26, 2011.
U.S. Appl. No. 61/041,404, "Solid State Lighting Devices and Methods of Manufacturing Same".
U.S. Appl. No. 60/130,411, "Light Source With Near Field Mixing".
U.S. Appl. No. 61/037,365.
International Search Report and Written Opinion fro PCT Application No. PCT/US2010/003190, dated Apr. 6, 2011.
Office Action from Japanese Patent Application No. 2007-533459(Appeal No. 2009-006588) dated Jul. 16, 2010.
Office Action from Chinese Patent Appl. No. 200780012387.0, dated Jun. 30, 2010.
Patent Abstracts of Japan No. 2002-050799, dated Feb. 15, 2002 to Stanley Electric Co., Ltd.
From related application. Japanese Patent Appl. No. 2006-526964, Official Notice of Rejection, dated Feb. 16, 2010.
Patent Abstracts of Japan, Pub. No. 2003-258011, dated Sep. 12, 2003.
Patent Abstracts of Japan, Pub. No. 2002-093830, dated Mar. 29, 2002.
Office Action from related U.S. Appl. No. 11/656,759, dated Nov. 25, 2009.
Office Action from related U.S. Appl. No. 11/398,214, dated Dec. 11, 2009.
Office Action from related U.S. Appl. No. 10/666,399, dated Dec. 22, 2009.
Office Action from related U.S. Appl. No. 11/982,276, dated Mar. 25, 2010.
Office Action from related U.S. Appl. No. 11/827,626, dated Apr. 1, 2010.
Office Action from U.S. Appl. No. 11/982,276, dated May 19, 2009.
Response to Office Action from U.S. Appl. No. 11/982,276, filed Aug. 17, 2009.
Office Action from U.S. Appl. No. 12/288,957, dated Sep. 21, 2010.
Response to Office Action from U.S. Appl. No. 12/288,957, filed Dec. 21, 2010.
Office Action from U.S. Appl. No. 12/629,735, dated Sep. 22, 2010.
Response to Office Action from U.S. Appl. No. 12/629,735, filed Dec. 22, 2010.
Office Action from U.S. Appl. No. 12/288,957, dated Mar. 9, 2011.
Office Action from U.S. Appl. No. 12/629,735, dated Mar. 10, 2011.
Office Action from U.S. Appl. No. 12/156,995, dated Mar. 10, 2010.
Response to Office Action from U.S. Appl. No. 12/156,995, filed Sep. 10, 2010.
Office Action from U.S. Appl. No. 12/156,995, dated Nov. 17, 2010.
Response to Office Action U.S. Appl. No. 12/156,995, filed: Apr. 18, 2011.
Office Action from U.S. Appl. No. 11/982,276, dated Dec. 7, 2009.
Response to Office Action from U.S. Appl. No. 11/982,276, filed: Feb. 5, 2010.
Office Action from U.S. Appl. No. 11/982,276, dated Feb. 18, 2010.
Response to Office Action from U.S. Appl. No. 11/982,276, filed: Mar. 8, 2010.
Response to Office Action from U.S. Appl. No. 11/982,276, filed: Jun. 21, 2010.
Office Action from U.S. Appl. No. 11/982,276, dated Aug. 19, 2010.
Office Action for U.S. Appl. No. 12/883,979, dated Sep. 12, 2011.
Response to Office Action Sep. 12, 2011, U.S. Appl. No. 12/883,979, filed Feb. 7, 2012.
Notice of Allowance from U.S. Appl. No. 12/883,979, dated Mar. 19, 2012.
Office Action for U.S. Appl. No. 12/156,995, dated Aug. 30, 2011.
Response to Office Action dated Aug. 30, 2011, U.S. Appl. No. 12/156,995, filed Nov. 29, 2011.
Office Action for U.S. Appl. No. 12/288,957, dated Oct. 18, 2011.
Response to Office Action dated Oct. 18, 2011, U.S. Appl. No. 12/288,957, filed Dec. 19, 2011.
Advisory Action for U.S. Appl. No. 12/288,957, dated Jan. 11, 2012.
Response to Advisory Action U.S. Appl. No. 12/288,957, filed Feb. 15, 2012.
Office Action for U.S. Appl. No. 11/982,276, dated Feb. 22, 2012.
Response to Office Action U.S. Appl. No. 12/629,735, filed Aug. 8, 2011.
Office Action U.S. Appl. No. 12/156,995, dated Mar. 10, 2010.
Response to Office Action U.S. Appl. No. 12/156,995, filed Sep. 10, 2010.
Office Action U.S. Appl. No. 12/629,735, dated Sep. 22, 2010.
Response to Office Action U.S. Appl. No. 12/629,735, filed Dec. 22, 2010.
Office Action U.S. Appl. No. 12/156,995, dated Nov. 17, 2010.
Office Action U.S. Appl. No. 12/288,957, dated Sep. 21, 2010.
Response to Office Action U.S. Appl. No. 12/288,957, filed Dec. 21, 2010.
Office Action U.S. Appl. No. 12/288,957, dated Mar. 9, 2011.
Response to Office Action U.S. Appl. No. 12/288,957, filed Aug. 8, 2011.
First Office Action from Chinese Patent Application 200980142352.8, dated Aug. 27, 2012.
Notice of Reasons for Rejection from Japanese Patent Application No. 2008-221738, dated May 29, 2012.
First Office Action for Chinese Patent Application No. 200980125244.X, dated May 28, 2012.
Notice of Reasons for Rejection in Japanese Patent Application No. 2011-512442, dated Aug. 7, 2012.

(56) References Cited

OTHER PUBLICATIONS

Reason for Rejection for Japanese Patent Application No. 2011-510484, dated Aug. 7, 2012.
International Search Report and Written Opinion from PCT/US2011/001200, dated Apr. 27, 2012.
First Office Action for Chinese Patent Application No. 201230001815.3, dated Apr. 11, 2012.
Summary of Notice of Reasons for Rejection from Japanese Patent Application No. 2007-228699, dated May 8, 2012.
Search Report from Chinese Patent Application No. 200980125244.X, dated Nov. 5, 2012.
Second Office Action from Chinese Patent Application No. 200980125244.X, dated Nov. 26, 2012.
PCT Preliminary Report and Written Opinion from PCT Appl. No. PCT/US2011/001200, dated Jan. 17, 2013.
Office Action from Japanese Patent Appl. No. 2011-533175, dated Jul. 25, 2013.
Notice of Reconsideration from Japanese Patent Appl. No. 2008-221738, dated Jul. 9, 2013.
International Search Report and Written Opinion for Appl. No. PCT/US2013/038391, dated Aug. 8, 2013.
Examination Report from European Patent Appl. No. 10 757 645.6-1802, dated Jun. 28, 2013.
Decision of Rejection and Decision of Declining Amendment from Japanese Patent appl No. 2011-512442, dated Jun. 19, 2013.
Decision of Rejection from Japanese Patent Application No. 2008-221738, dated Feb, 26, 2013.
Decision of Dismissal of Amendment from Japanese Patent Application No. 2008-221738, dated Feb. 26, 2013.
Office Action from Japanese Patent Application No. 2011-512442, dated Feb. 22, 2013.
Satoshi Emoto, "How to make Mobile", [on line], May 30, 2001, ITmedia (searched on Feb. 15, 2013), internet URL:http//www.itmedia.co.jp/mobile/rensai/howtomake/04.
Office Action from Japanese Patent Appl. No. 2007-228699, dated Mar. 6, 2013.
Notice of Reasons for Rejection from Japanese Patent Application No. 2011-533175, dated Apr. 2, 2013.
Second Office Action from Chinese Patent Application No. 200980142352.8, dated May 6, 2013.
Third Office Action from Chinese Patent Application No. 200980125244.X, dated May 31, 2013.
Office Action from U.S. Appl. No. 12/156,995, dated Apr. 12, 2012.
Office Action from U.S. Appl. No. 11/982,276, dated Aug. 7, 2012.
Response to OA from U.S. Appl. No. 12/156,995, filed Sep. 12, 2012.
Response to OA from U.S. Appl. No. 11/982,276, filed Sep. 25, 2012.
Office Action from U.S. Appl. No. 12/643,670, dated Oct. 1, 2012.
Office Action from U.S. Appl. No. 11/982,276, dated Oct. 10, 2012.
Office Action from U.S. Appl. No. 13/489,035, dated Jan. 22, 2013.
Office Action from U.S. Appl. No. 12/862,640, dated Jan. 24, 2013.
Office Action from U.S. Appl. No. 13/029,005, dated Jan. 24, 2013.
Response to OA from U.S. Appl. No. 12/643,670, filed Dec. 21, 2012.
Response to OA from U.S. Appl. No. 11/982,276, filed Oct. 31, 2012.
Response to OA from U.S. Appl. No. 13/489,035, filed Jun. 5, 2013.
Response to OA from U.S. Appl. No. 12/862,640, filed Apr. 17, 2013.
Response to OA from U.S. Appl. No. 13/029,005, filed Apr. 17, 2013.
Office Action from U.S. Appl. No. 12/629,735, dated Feb. 8, 2013.
Office Action from U.S. Appl. No. 12/544,131, dated Jan. 15, 2013.
Office Action from U.S. Appl. No. 12/643,705, dated Jun. 13, 2012.
Response to OA from U.S. Appl. No. 12/629,735, filed Jun. 10, 2013.
Response to OA from U.S. Appl. No. 12/544,131, filed Mar. 13, 2013.
Response to OA from U.S. Appl. No. 12/643,705, filed Sep. 10, 2012.
Office Action from U.S. Appl. No. 11/982,276, dated May 29, 2013.
Office Action from U.S. Appl. No. 12/862,640, dated Apr. 30, 2013.
Office Action from U.S. Appl. No. 12/288,957, dated Mar. 26, 2013.
Response to OA from U.S. Appl. No. 12/288,957, filed Jun. 21, 2013.
Decision of Rejection from Chinese Patent Application No. 200980125244.X, dated Jan. 13, 2014.
Office Action from Japanese Patent Appl. No. 2013-064671, dated Feb. 3, 2014.
Appeal Board's Questioning from Japanese Patent Appl. No. 2011-512442, dated Jan. 17, 2014.
Extended European Search Report from European Patent Appl. No. 13197857.9, dated Feb. 7, 2014.
European Search Report from European Patent Appl. No. 10757645.6, dated Feb. 2, 2014.
Interrogation from Japanese Patent Appl. No 208-221738, dated Sep. 10, 2013.
First Office Action from Chinese Patent Appl. No. 200980125251, dated Aug. 8, 2013.
Search Report from Chinese Patent Appl. No. 200980125251, dated Jul. 31, 2013.
Office Action from U.S. Appl. No. 12/629,735, dated Sep. 18, 2013.
Office Action from U.S. Appl. No. 13/489,035, dated Aug. 5, 2013.
Response to OA from U.S. Appl. No. 13/489,035, filed Oct. 7, 2013.
Office Action from U.S. Appl. No. 12/156,995, dated Aug. 28, 2013.
Office Action from U.S. Appl. No. 12/288,957, dated Sep. 13, 2013.
Office Action from U.S. Appl. No. 12/643,670, dated Jun. 25, 2013.
European Examination from European Patent appl. No. 11746482.4-1757, dated Feb. 21, 2014.
Decision of Rejection from Japanese Patent Appl. No. 2007-228699, dated Mar. 18, 2014.
European Search Report from European Patent appl. No. 08252829.0, dated Feb. 28, 2014.
Office Action from Taiwanese Patent appl. No. 098109589, dated Feb. 18, 2014.
Office Action from U.S. Appl. No. 12/156,995, dated Jan. 24, 2014.
Notice of Reasons for Rejection from Japanese Patent Appl. No. 2012-544480, dated Oct. 29, 2013.
Office Action from U.S. Appl. No. 11/982,276. dated Oct. 25, 2013.
Office Action from U.S. Appl. No. 13/971,547, dated Nov. 6, 2013.
Third Office Action and Search Report from Chinese Patent Appl. No. 2009801142352.8, dated Nov. 26, 2013.
Office Action from Japanese Patent Appl. No. 2008-221738 dated Apr. 8, 2014.
Second Office Action from Chinese Patent Appl. No. 200980125251.X dated Apr. 3, 2014.
Office Action from Japanese Patent Appl. No. 2011-533175 dated Apr. 28, 2014.
Office Action from U.S. Appl. No. 12/643,670, dated Mar. 31, 2014.
Fourth Office Action from Chinese Patent Appl. No. 2009801423528, dated May 29, 2014.
Office Action from U.S. Appl. No. 12/156,995, dated May 7, 2014.
Office Action from U.S. Appl. No. 13/971,547, dated May 8, 2014.
Response to Office Action from U.S. Appl. No. 13/971,547, dated Jul. 11, 2014.
Office Action from Taiwanese Patent Appl. No. 098136067, dated Jun. 26, 2014.
Office Action from Taiwanese Patent Appl. No. 098109589, dated Jul. 11, 2014.
Office Action and Search Report from Taiwanese Patent Appl. No. 098109421, dated Aug. 22, 2014.
Notice of Reasons for Rejection from Japanese Patent Appl. No. 2012-544480, dated Aug. 5, 2014.
Office Action from U.S. Appl. No. 12/288,957, dated Aug. 12, 2014.
First Office Action and Search Report from Chinese Appl. No. 2011800428038, dated Jan. 21, 2015.
Office Action from Korean Appl. No. 10-2011-7000240, dated Feb. 17, 2015.
Office Action from Taiwanese Appl. No. 098136067, dated Jan. 21, 2015.

(56) References Cited

OTHER PUBLICATIONS

First Office Action from Chinese Patent Appl. No. 201210492856.6, dated Jan. 5, 2015.
Notification of Reexamination from Chinese Patent Appl. No. 200980125244X, dated Mar. 2, 2015.
Office Action from Korean Patent Appl. No. 10-2010-7028850, dated Feb. 17, 2015.
Office Action from U.S. Appl. No. 12/156,995, dated Dec. 8, 2014.
Office Action from U.S. Appl. No. 12/629,735, dated Dec. 18, 2014.
Office Action from U.S. Appl. No. 13/833,272, dated Dec. 31, 2014.
Office Action from U.S. Appl. No. 12/288,957, dated Feb. 5, 2015.
Third Office Action from Chinese Appl. No. 200980125251.X, dated Oct. 31, 2014.
Pretrial Report from Japanese Appl. No. 2011-533175, dated Oct. 8, 2014.
Office Action from Taiwanese Patent Appl. No. 099105210, dated Oct. 20, 2014.
Reexamination Report from Japanese Appl. No. 2007-228699, dated Nov. 7, 2014.
Appeal Decision from Japanese Appl. No. 2013-12017, dated Nov. 25, 2014.
Reasons for Rejection from Japanese Appl. No. 2613-064671, dated Nov. 18, 2014.
International Preliminary Report from Appl. No. PCT/US2013/038391, dated Nov. 25, 2014.
Office Action from U.S. Appl. No. 12/156,995, dated Sep. 26, 2014.
Response to OA from U.S. Appl. No. 12/156,995, filed Nov. 19, 2014.
Office Action from U.S. Appl. No. 12/643,670, dated Oct. 15, 2014.
Office Action from U.S. Appl. No. 11/982,276, dated Oct. 23, 2014.
Office Action from U.S. Appl. No. 12/288,957, dated Nov. 19, 2014.
Fifth Office Action from Chinese Appl. No. 2009801423528, dated Dec. 31, 2014.
Second Office Action from Chinese Appl. No. 201080062058.9, dated Dec. 31, 2014.
Final Notice for Reasons for Rejection from Japanese Patent appl. No. 2013-064671, dated Jun. 2, 2015.
Decision of Rejection from Chinese Patent Appl. No. 200980142352.8, dated Jul. 14, 2015.
Office Action from U.S. Appl. No. 12/629,735, dated Jul. 15, 2015.
Office Action from U.S. Appl. No. 12/288,957, dated Jul. 30, 2015.
Office Action from Japanese Patent Appl. No. 2011-533175, dated Apr. 28, 2015.
Office Action from Taiwanese Patent Appl. No. 099145035, dated Apr. 24, 2015.
Summons to attend oral hearing from European Appl. No. 10757645.6-1802, dated Apr. 30, 2015.
Office Action from Japanese Appl. No. 2013-064671, dated Jun. 2, 2015.
Office Action from Taiwanese Appl. No. 098109421, dated Apr. 22, 2015.
Decision of Rejection and Non Acceptance of Amendment from Japanese Patent Appl. No. 2012-544480, dated May 12, 2015.
Office Action from U.S. Appl. No. 11/982,276, dated Apr. 16, 2015.
Office Action from U.S. Appl. No. 12/643,670, dated Apr. 24, 2015.
Office Action from U.S. Appl. No. 12/156,995, dated May 5, 2015.
Office Action for Japanese Application No. 2007-228699; dated Apr. 1, 2016.
Sixth Office Action for Chinese Application No. 2009801423528, dated Apr. 1, 2016.
Notice of Allowance for Application No. 10757645.6; dated Apr. 15, 2016.
Dedision of Grant for Application No. 2012-544480; dated May 31, 2016.
Notice of Issuance for Chinese Application No. 20098012544, dated Jun. 16, 2016.
Office Action from U.S. Appl. No. 11/982,276; dated Aug. 18, 2016.
Office Action from U.S. Appl. No. 12/156,995; dated Aug. 23, 2016.
Office Action from U.S. Appl. No. 13/833,272; dated Aug. 23, 2016.
Office Action from Chinese Patent Application No. 2009801423528; dated Sep. 21, 2016.
Office Action from European Patent Application No. 11748482.4; dated Oct. 18, 2016.
Examination Report from European Patent appl. No. 11 748 482.4-1757, dated Nov. 16, 2015.
Decision of Rejection from Japanese Patent Appl. No. 2013-064671, dated Dec. 28, 2015.
Notification of Reexamination from Chinese Patent Appl. No. 200980125244X, dated Oct. 15, 2015.
Notification of Filing Receipt (Reexamination) from Chinese Patent Appl. No. 200980142352.8, dated Nov. 10, 2015.
Trial Decision from Japanese Patent Appl. No. 2011-533175, dated Oct. 27, 2015.
Decision to Refuse a European Patent Application, European Patent Appl. No. 10757645.6, dated Oct. 27, 2015.
Decision of Reexamination from Chinese Patent Appl. No. 200980142352.8, dated Dec. 2, 2015.
Office Action from U.S. Appl. No. 13/833,272; dated Jan. 6, 2016.
Office Action from U.S. Appl. No. 11/982,276; dated Feb. 4, 2016.
Office Action from U.S. Appl. No. 12/156,995; dated Feb. 16, 2016.
Office Action from U.S. Appl. No. 12/156,995, dated Sep. 4, 2015.
Office Action from U.S. Appl. No. 13/833,272, dated Sep. 24, 2015.
Office Action for U.S. Appl. No. 12/156,995; dated Dec. 23, 2017.
Official Decision for Japanese Patent Appl. No. 2007-228699; dated Jan. 20, 2017.
Office Action for U.S. Appl. No. 11/982,276; dated Apr. 14, 2017.
Oral Proceedings for European Application No. 9758647.3; Dated Apr. 12, 2017.
Office Action for Chinese Application No. 200980142352.8; dated Jun. 2, 2017.
Foreign Office Action for European Application No. 08 252 829.0; dated Feb. 15, 2018.
Foreign Office Action for European Application No. 09 745 149.6; dated May 15, 2018.
Yang Chih-Chieh et al: "Highly stable three-band white light from an InGaN-based blue light-emitting diode chip precoated with (oxy)nitride green/red phosphors", Applied Physics Letters, AIP, American Institute of Physics, Melville, NY, US, vol. 90, No. 12, Mar. 20, 2007 (Mar. 20, 2007), pp. 123503-123503, XP012093758, ISSN: 0003-6951.
Office Action for U.S. Appl. No. 11/982,276; dated Oct. 30, 2017.
Office Action for European Application No. 08 252 829.0; dated Feb. 15, 2018.

* cited by examiner

FIG. 17
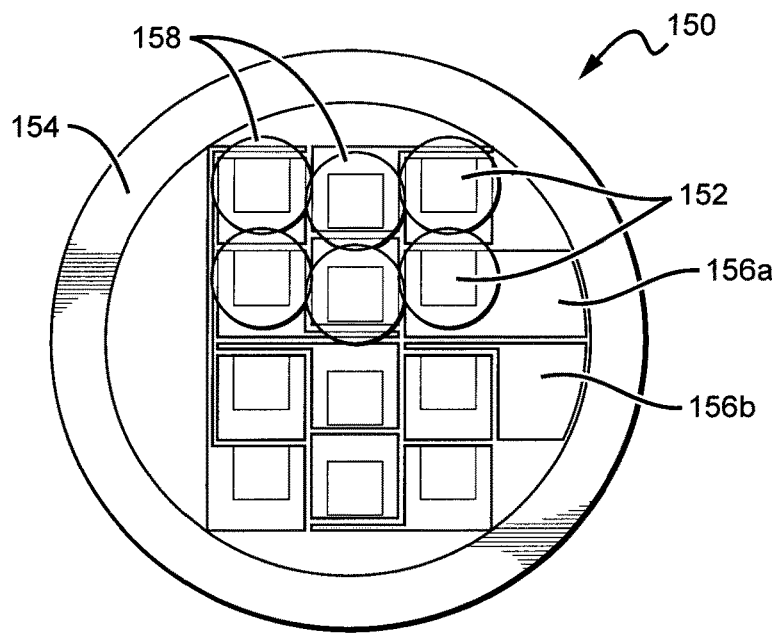
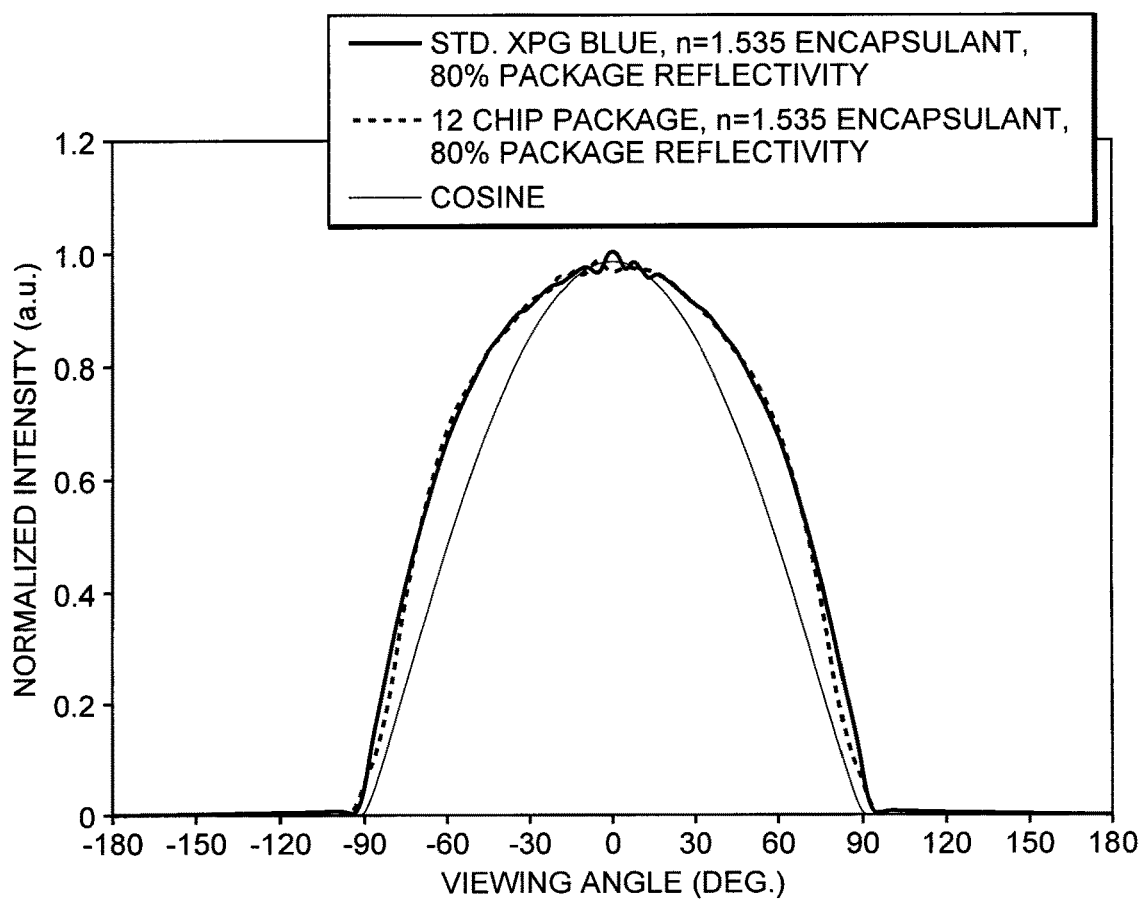
FIG. 18

COMPACT OPTICALLY EFFICIENT SOLID STATE LIGHT SOURCE WITH INTEGRATED THERMAL MANAGEMENT

This application claims the benefit of U.S. Provisional Patent Application Ser. No. 61/339,084, filed on Jul. 6, 2010.

BACKGROUND OF THE INVENTION

Field of the Invention

This invention relates to solid state lighting and in particular to solid state light sources or lamps that comprise a compact array of light emitting diodes (LEDs).

Description of the Related Art

Light emitting diodes (LED or LEDs) are solid state devices that convert electric energy to light, and generally comprise one or more active layers of semiconductor material sandwiched between oppositely doped layers. When a bias is applied across the doped layers, holes and electrons are injected into the active layer where they recombine to generate light. Light is emitted from the active layer and from all surfaces of the LED.

LEDs have certain characteristics that make them desirable for many lighting applications that were previously the realm of incandescent or fluorescent lights. Incandescent lights are very energy-inefficient light sources with approximately ninety percent of the electricity they consume being released as heat rather than light. Fluorescent light bulbs are more energy efficient than incandescent light bulbs by a factor of about 10, but are still relatively inefficient. LEDs by contrast, can emit the same luminous flux as incandescent and fluorescent lights using a fraction of the energy.

In addition, LEDs can have a significantly longer operational lifetime. Incandescent light bulbs have relatively short lifetimes, with some having a lifetime in the range of about 750-1000 hours. Fluorescent bulbs can also have lifetimes longer than incandescent bulbs such as in the range of approximately 10,000-20,000 hours, but provide less desirable color reproduction. In comparison, LEDs can have lifetimes between 50,000 and 70,000 hours. The increased efficiency and extended lifetime of LEDs is attractive to many lighting suppliers and has resulted in their LED lights being used in place of conventional lighting in many different applications. It is predicted that further improvements will result in their general acceptance in more and more lighting applications. An increase in the adoption of LEDs in place of incandescent or fluorescent lighting would result in increased lighting efficiency and significant energy saving.

In order to use an LED chip in a circuit or other like arrangement, it is known to enclose an LED chip in a package to provide environmental and/or mechanical protection, color selection, light focusing and the like. An LED package also includes electrical leads, contacts or traces for electrically connecting the LED package to an external circuit. In a typical LED package/component 10 illustrated in FIG. 1, a single LED chip 12 is mounted on a reflective cup 13 by means of a solder bond or conductive epoxy. One or more wire bonds 11 connect the ohmic contacts of the LED chip 12 to leads 15A and/or 15B, which may be attached to or integral with the reflective cup 13. The reflective cup 13 may be filled with an encapsulant material 16 which may contain a wavelength conversion material such as a phosphor. Light emitted by the LED at a first wavelength may be absorbed by the phosphor, which may responsively emit light at a second wavelength. The entire assembly is then encapsulated in a clear protective resin 14, which may be molded in the shape of a lens to collimate the light emitted from the LED chip 12. While the reflective cup 13 may direct light in an upward direction, optical losses may occur when the light is reflected (i.e. some light may be absorbed by the reflector cup due to the less than 100% reflectivity of practical reflector surfaces). In addition, heat retention may be an issue for a package such as the package 10 shown in FIG. 1, since it may be difficult to extract heat through the leads 15A, 15B.

LED component 20 illustrated in FIG. 2 may be more suited for high power operations which may generate more heat. In LED component 20, one or more LED chips 22 are mounted onto a carrier such as a printed circuit board (PCB) carrier, substrate or submount 23. A metal reflector 24 is mounted on the submount 23, surrounds the LED chip(s) 22, and reflects light emitted by the LED chips 22 away from the package 20. The reflector 24 also provides mechanical protection to the LED chips 22. One or more wire bond connections 11 are made between ohmic contacts on the LED chips 22 and electrical traces 25A, 25B on the submount 23. The mounted LED chips 22 are then covered with an encapsulant 26, which may provide environmental and mechanical protection to the chips while also acting as a lens. The metal reflector 24 is typically attached to the carrier by means of a solder or epoxy bond.

Other LED components or lamps have been developed that comprise an array of multiple LED packages mounted to a (PCB), substrate or submount. The array of LED packages can comprise groups of LED packages emitting different colors, and specular reflector systems to reflect light emitted by the LED chips. Some of these LED components are arranged to produce a white light combination of the light emitted by the different LED chips.

Techniques for generating white light from a plurality of discrete light sources have been developed that utilize different hues from different discrete light sources, such as those described in U.S. Pat. No. 7,213,940, entitled "Lighting Device and Lighting Method". These techniques mix the light from the discrete sources to provide white light. In some applications, mixing of light occurs in the far field such that when viewed directly the different hued sources of light can be separately identified, but in the far field the light combines to produce light which is perceived as white. One difficulty with mixing in the far field is that the individual discrete sources can be perceived when the lamp or luminaire is viewed directly. Accordingly, the use of only far field mixing may be most appropriate for these lighting applications where the light sources are mechanically obscured from a user's view. However, mechanically obscuring the light sources may result in lower efficiency as light is typically lost by the mechanical shielding.

Current LED packages (e.g. XLamp® LEDs provided by Cree, Inc.) can be limited in the level of input power and for some the range is 0.5 to 4 Watts. Many of these conventional LED packages incorporate one LED chip and higher light output is achieved at the assembly level by mounting several of these LED packages onto a single circuit board. FIG. 3 shows a sectional view of one such distributed integrated LED array 30 comprising a plurality of LED packages 32 mounted to a substrate or submount 34 to achieve higher luminous flux. Typical arrays include many LED packages, with FIG. 3 only showing two for ease of understanding. Alternatively, higher flux components have been provided by utilizing arrays of cavities, with a single LED chip mounted in each of the cavities. (e.g. TitanTurbo™ LED Light Engines provided by Lamina, Inc.).

These LED array solutions are less compact than desired as they provide for extended non-light emitting "dead space"

between adjacent LED packages and cavities. This dead space provides for larger devices, and can limit the ability to diffuse light from the LED packages and can limit the ability to shape the output beam by a single compact optical element like a collimating lens or reflector into a particular angular distribution. This makes the construction of solid state lighting luminares that provide for directed or collimated light output within the form factor of existing lamps difficult to provide. These present challenges in providing a compact LED lamp structure incorporating an LED component that delivers light flux levels in the 1000 lumen and higher range from a small optical source.

In other array technologies, individual blue LEDs can be assembled on a circuitized substrate (i.e. chip-on-board). The LEDs are then encapsulated together utilizing a flat profile where the encapsulant contains a phosphor to enable down conversion. This approach, however, is not efficient from a light extraction perspective because of the difference in the refractive index of the flat encapsulent and the surrounding material. A portion of the light can be reflected back at the surface of the encapsulant where a portion of it can be absorbed by components that are less than ideal reflectors. Additional light can be lost to total internal reflection (TIR). To be more efficient, these technologies can require optimal reflectivity within the regions where light is generated.

SUMMARY OF THE INVENTION

The present invention is directed to solid state light sources that are compact, efficient and compatible with high volume manufacturing processes. The present invention relates to improved arrangements of LED chips and lenses/optics on a substrate that provide efficiency improvements, such as first pass light extraction from the lenses/optics LED while maintaining efficient component thermal management.

One embodiment of LED component according to the present invention comprises a circuit board having a plurality of die attach pads. A plurality of LED chips is included each of which is mounted on a respective one of the die attach pads. Primary lenses are included each of which is formed directly over a single one or a subgroup of the LED chips.

Another embodiment of an LED component according to the present invention comprises a circuit board with an array of LED chips mounted on it and electrically interconnected. A plurality of primary lenses is included, each of which is formed directly over a single one or a subgroup of the LED chips. A heat sink is included with the circuit board mounted to the heat sink so that heat from the LED chips spreads into the heat sink.

One embodiment of a solid state lighting component according to the present invention comprises a circuit board that is thermally conductive and electrically insulating. A plurality of LED chips is included, each of which is chip-on-board mounted on a respective one of the die attach pads. A plurality of primary lenses is included each of which is formed directly over a single one or a subgroup of the LED chips.

A method of forming an LED component comprises providing a circuit board and chip-on-board mounting LED chips on the circuit board with the LED chips electrically interconnected. Primary lenses are molded directly over each of the LED chips individually or in sub-groups of the LED chips.

These and other aspects and advantages of the invention will become apparent from the following detailed description and the accompanying drawings which illustrate by way of example the features of the invention.

BRIEF DESCRIPTION OF THE DRAWINGS

FIG. 17 is a perspective view of the LED component shown in FIG. 16;
FIG. 18 is a graph showing the operating characteristics of some embodiments of an LED component according to the present invention.

DETAILED DESCRIPTION OF THE INVENTION

Figure 1:
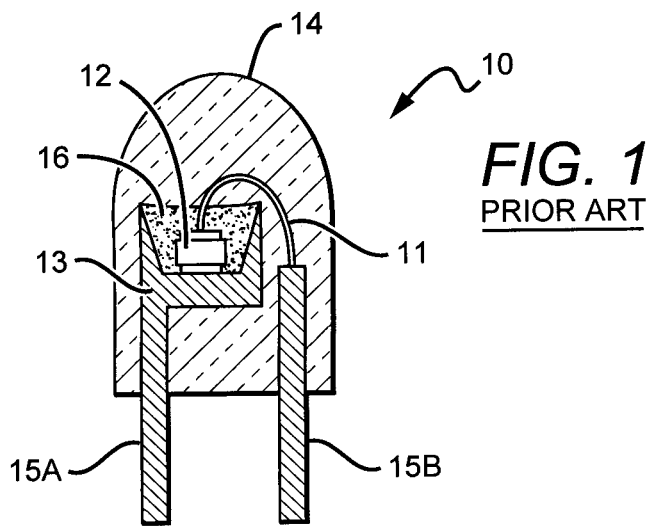
FIG. 1 shows a prior art LED package.
Figure 2:
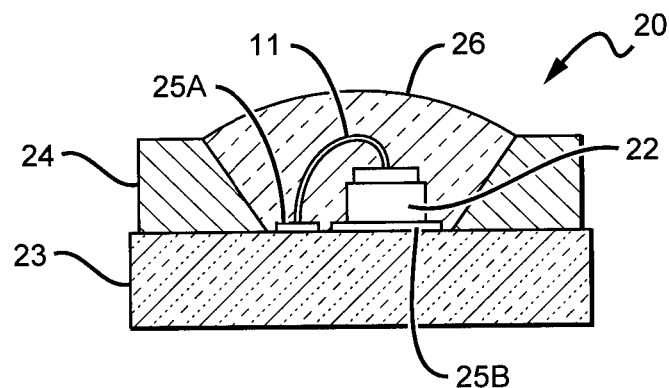
FIG. 2 shows another prior art LED package.
Figure 3:
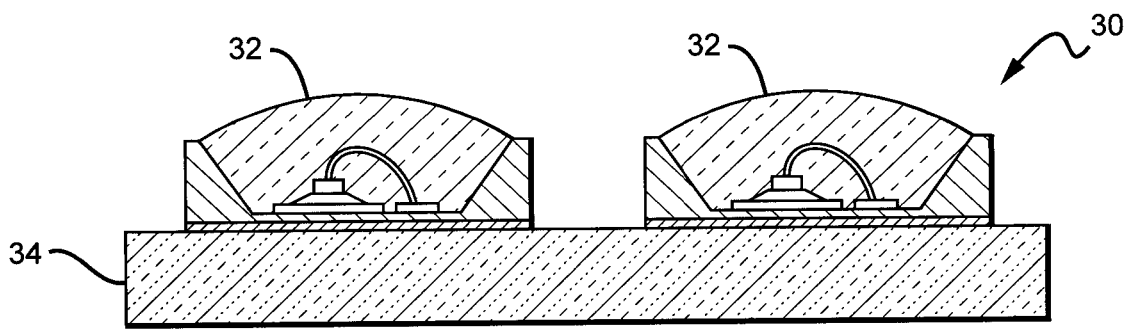
FIG. 3 shows a prior art LED component with an array of LED packages.

The present invention provides compact and efficient lighting components that utilize solid state devices as their light source. The different lighting components are sized such that they are capable of being used in many different lighting applications. In some embodiments the solid state light source can comprise an array of LEDs arranged to emit light in response to an electrical signal applied to the lighting component. Some embodiments of the present invention also provide LED array lighting components with improved light extraction efficiency enabled by improved optical and thermal properties. The present invention also incorporates optical designs that maximize first pass light extraction, and features that manage thermal loads to minimize thermal cross-talk between individual LED emitters.

Some embodiments of lighting components according to the present invention can comprise an LED chip array mounted on a thermally conductive substrate, with optics that minimizes emission crosstalk. Different embodiments can utilize chip-on-board (COB) technology to integrate multiple LEDs onto a single circuitized substrate with the "dead-space" between LEDs minimized and thereby minimizing the space required for the light source. COB refers to the semiconductor assembly techniques wherein a microchip or die, such as an LED, is directly mounted on and electrically interconnected to its final circuit board, instead of undergoing traditional assembly or packaging as an individual LED package or integrated circuit. The elimination of conventional device packaging when using COB assemblies can simplify the over-all process of designing and manufacturing, can reduce space requirements, can reduce cost, and can improve performance as a result of the shorter interconnection paths. The COB process can consist of three primary steps: 1) LED die attach or die mount; 2) wire bonding; and 3) encapsulation of the die and wires. These COB arrangements can also provide the added advantage of allowing for direct mounting and interface with the main system heat sink.

In some embodiments LED array embodiments, each chip in the array can have its own primary lens formed onto it to facilitate light extraction and emission with the first pass. First pass light extraction/emission refers to light emitted from a particular LED chip passing out of its primary lens and the light's first pass from the LED chip to the surface of the primary lens. That is, the light is not reflected back, such as by total internal reflection (TIR), where some of the light can be absorbed. This first pass emission enhances the emission efficiency of the LED components by minimizing LED light that can be absorbed. The different embodiments can comprise a high density of light emitting components while maximizing the light extraction, which maximizes the efficiency of the overall component. Some embodiments of the present invention can be arranged in sub-groups of LED chips within the array, with each sub-group having its own primary lens for improved light extraction. In some embodiments, the lens can be hemispheric, which can further increase light extraction by providing a lens surface that promotes first pass light emission.

Different embodiments of the present invention can include LED arrays with LED chips emitting the same color or different color (e.g. red, green and blue LED chips or subgroups, white LED and red LED chips or subgroups, etc.) Techniques for generating white light from a plurality of discrete light sources to provide desired CRI at the desired color temperature have been developed that utilize different hues from different discrete light sources. Such techniques are described in U.S. Pat. No. 7,213,940, entitled "Lighting Device and Lighting Method" mentioned above.

In other embodiments a secondary lens or optic may be used in addition to the primary lens or optics, e.g. a larger secondary optic over multiple groups of emitters with primary optics. With each emitter or groups of emitters having their own primary lens or optic, the invention may be scalable for larger arrays. Different arrays according to the present invention can have as little as three chips to 10s and 100s.

In some embodiments the LED array can be COB mounted to a board having characteristics that provide for improved operation. The board can provide electrical isolation characteristics, which allows for board level electrical isolation of the LED chips. At the same time the board can have properties that provide an efficient thermal path to spread heat from the LED chips. Efficient thermal spreading of heat from the LED chips can result in improved LED chip reliability and color consistency. The board can also be arranged to allow for easy and efficient mounting of the array to a primary heat sink. Some embodiments can comprise a circuit board having features that allow it to be easily and efficiently mounted to the heat sink using mechanical means. In other embodiments, the circuit board can comprise a material that allows it to be efficiently and reliably soldered to a heat sink, such as through reflow processes.

The present invention comprises LED array arrangements that are scalable, such that some embodiments can have as few as three emitters and others can have as many as 10s or 100s of emitters. Different embodiments of LED arrays can be scalable.

The present invention is described herein with reference to certain embodiments, but it is understood that the invention can be embodied in many different forms and should not be construed as limited to the embodiments set forth herein. In particular, the present invention is described below in regards to certain lighting or LED components having arrays of LEDs or LED chips in different configurations, but it is understood that the present invention can be used for many other lamps having many different array configurations. The components can have different shapes and sizes beyond those shown and different numbers of LEDs can be included in the arrays. Some or all of the LEDs in the arrays can be coated with a down-converter coating that can comprise a phosphor loaded binder ("phosphor/binder coating"), but it is understood that LEDs without a conversion material can also be used.

It is also understood that when an element such as a layer, region or substrate is referred to as being "on", "over" or "coating" another element, it can be directly on, over or coating the other element or intervening elements may also be present. Furthermore, relative terms such as "inner", "outer", "upper", "above", "lower", "beneath", and "below", and similar terms, may be used herein to describe a relationship of one layer or another region. It is understood that these terms are intended to encompass different orientations of the device in addition to the orientation depicted in the figures.

Although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Embodiments of the invention are described herein with reference to certain view illustrations that may be schematic illustrations of embodiments of the invention. As such, the actual size and thickness of elements can be different, and variations from the shapes of the illustrations as a result, for example, of manufacturing techniques and/or tolerances are expected. Embodiments of the invention should not be construed as limited to the particular shapes and sizes of the regions illustrated herein but are to include deviations in shapes that result, for example, from manufacturing. A region illustrated or described as square or rectangular can have rounded or curved features due to normal manufacturing tolerances. Thus, the regions illustrated in the figures are schematic in nature and their shapes are not intended to illustrate the precise shape of a region of a device and are not intended to limit the scope of the invention.

Figure 4:
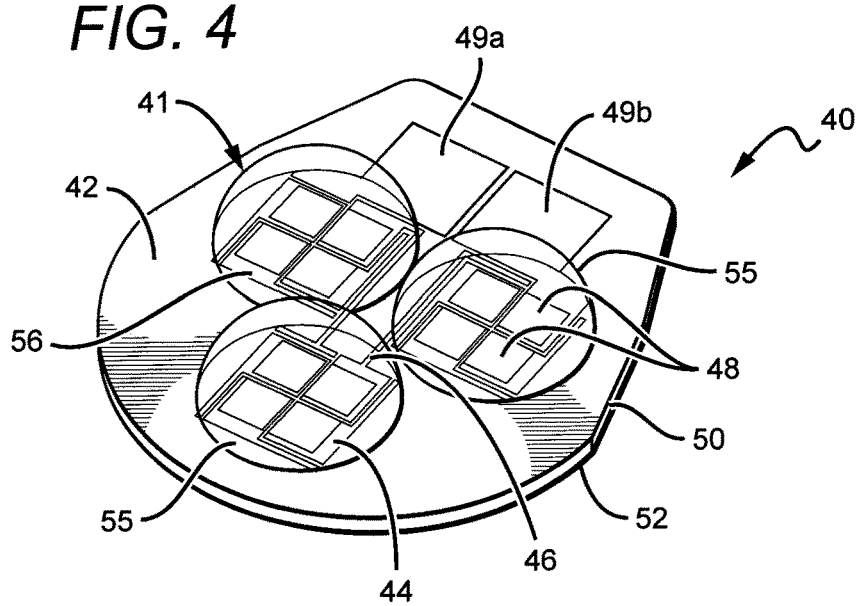
FIG. 4 is a perspective view of one embodiment of an LED component according to the present invention having an array of LED chips in sub-groups.

FIG. 4 shows one embodiment of an LED component 40 according to the present invention comprising a circuit board or submount ("board") 42 for holding an array of LED chips 41, with the board 42 having die attach pads 44 and conductive traces 46 on its top surface. The LED array 41 comprises a plurality of LED chips 48 each of which is mounted to a respective one of the die pads 44 using COB techniques. That is, the LED chips 48 are not included in their own package, with the package then mounted to the board (e.g. surface mounted). Instead, the LED chips 48 are mounted directly to die pads 44 on the board, with this COB arrangement providing the advantages discussed above.

In some embodiments, wire bonds can be included that pass between the conductive traces 46 and each of the LED chips 48 with an electrical signal applied to each of the LED chips 48 through its respective one of the die pads 44 and the wire bonds. In other embodiments, LED chips 48 may comprise coplanar electrical contacts on one side of the LED (bottom side) with the majority of the light emitting surface being located on the LED side opposing the electrical contacts (upper side). Such flip-chip LEDs can be mounted onto the board 42 by mounting contacts corresponding to one electrode (anode or cathode, respectively) onto the die pad 44. The contacts of the other LED electrode (cathode or anode, respectively) can be mounted to the traces 46.

In the embodiment shown, the LED array 41 comprises twelve individual LED chips 48, but it is understood that other embodiments can have fewer or more LED chips. The LED chips 48 are also arranged in three sub-groups of four LED chips 48 each, with the sub-groups electrically interconnected by the traces 46. It is understood that other embodiments can comprise different numbers of sub-groups having different numbers of LED chips interconnected in different ways. It is also understood that other embodiments can comprise only individual interconnected LED chips, or combinations of individual LED chips and sub-groups of LED chips.

In the embodiment shown, the LED chips 48 can be connected in series such that an electrical signal applied to first and second wire bond pads 49a, 49b conducts to all the LED chips and causes them to emit light. The sub-groups of LED chips are connected in series and the LED chips within the sub-groups are connected in series. It is understood, however, that in other embodiments some or all of the LED chips can be connected in parallel between the contacts, while in other embodiments the LED chips can be interconnected in different series and parallel combinations. These different combinations can comprise separate LED chip circuits that can be driven by their own separate drive signal. This allows for the intensity of the different circuits to be individually controlled to control the LED component's emission color and intensity. In these embodiments, more than two wire bond pads can be included to accommodate more than one drive signal. The first and second wire bond pads 49a, 49b should be sized to allow convenient and reliable wire bond attachment, with some embodiments having a surface area greater than 3 mm$^2$, while in other embodiments the surface area can be greater than 6 mm$^2$.

LEDs chips 48 can have many different semiconductor layers arranged in different ways and can emit many different colors in different embodiments according to the present invention. Many different commercially available LED chips can be used, including but not limited to the EZ LED chip commercially available from CREE, Inc. LED structures, features, and their fabrication and operation are generally known in the art and only briefly discussed herein.

The layers of the LEDs chips 48 can be fabricated using known processes with a suitable process being fabrication using metal organic chemical vapor deposition (MOCVD). The layers of the LED chips generally comprise an active layer/region sandwiched between first and second oppositely doped epitaxial layers all of which are formed successively on a growth substrate. LED chips can be formed on a wafer and then singulated for mounting in a package. It is understood that the growth substrate can remain as part of the final singulated LED or the growth substrate can be fully or partially removed.

It is also understood that additional layers and elements can also be included in the LED chips 48, including but not limited to buffer, nucleation, contact and current spreading layers as well as light extraction layers and elements. The active region can comprise single quantum well (SQW), multiple quantum well (MQW), double heterostructure or super lattice structures. The active region and doped layers may be fabricated from different material systems, with preferred material systems being Group-III nitride based material systems. Group-III nitrides refer to those semiconductor compounds formed between nitrogen and the elements in the Group III of the periodic table, usually aluminum (Al), gallium (Ga), and indium (In). The term also refers to ternary and quaternary compounds such as aluminum gallium nitride (AlGaN) and aluminum indium gallium nitride (AlInGaN). In a preferred embodiment, the doped layers are gallium nitride (GaN) and the active region is InGaN. In alternative embodiments the doped layers may be AlGaN, aluminum gallium arsenide (AlGaAs) or aluminum gallium indium arsenide phosphide, aluminum indium gallium phosphide or Zinc Oxide The growth substrate can be made of many materials such as silicon, glass, sapphire, silicon carbide, aluminum nitride (AlN), gallium nitride (GaN), with a suitable substrate being a 4H polytype of silicon carbide, although other silicon carbide polytypes can also be used including 3C, 6H and 15R polytypes. Silicon carbide has certain advantages, such as a closer crystal lattice match to Group III nitrides than sapphire and results in Group III nitride films of higher quality. Silicon carbide also has a very high thermal conductivity so that the total output power of Group-III nitride devices on silicon carbide is not limited by the thermal dissipation of the substrate (as may be the case with some devices formed on sapphire). SiC substrates are available from Cree Research, Inc., of Durham, N.C. and methods for producing them are set forth in the scientific literature as well as in a U.S. Pat. Nos. Re. 34,861; 4,946,547; and 5,200,022.

The LED chips 48 can also comprise a conductive current spreading structure and wire bond pads on the top surface, both of which are made of a conductive material and be deposited using known methods. Some materials that can be used for these elements include Au, Cu, Ni, In, Al, Ag or combinations thereof and conducting oxides and transparent conducting oxides. The current spreading structure can comprise conductive fingers arranged in a grid on the LED chips 48 with the fingers spaced to enhance current spreading from the pads into the LED's top surface. In operation, an electrical signal is applied to the pads through a wire bond as described below, and the electrical signal spreads through the fingers of the current spreading structure and the top surface into the LED chips 48. Current spreading structures are often used in LEDs where the top surface is p-type, but can also be used for n-type materials.

Some or all of the LED chips 48 can be coated with one or more phosphors with the phosphors absorbing at least some of the LED light and emitting a different wavelength of light such that the LED emits a combination of light from the LED and the phosphor. As described in detail below, in one embodiment according to the present invention at least some of the LED chips can comprise an LED that emits light in the blue wavelength spectrum with its phosphor absorbing some of the blue light and re-emitting yellow light. These LED chips 48 emit a white light combination of blue and yellow light or a non-white light combination of blue and yellow light. As used herein, the term "white light" refers to light that is perceived as white and is within 7 MacAdam ellipses of the black body locus on a 1931 CIE chromaticity diagram and has a CCT ranging from 2000 K to 10,000 K. In one embodiment the phosphor comprises commercially available YAG:Ce, although a full range of broad yellow spectral emission is possible using conversion particles made of phosphors based on the $(Gd,Y)_3(Al,Ga)_5O_{12}$:Ce system, such as the $Y_3Al_5O_{12}$:Ce (YAG). Other yellow phosphors that can be used for white emitting LED chips include:

$Tb_{3-x}RE_xO_{12}$:Ce(TAG); RE=Y, Gd, La, Lu; or
$Sr_{2-x-y}Ba_xCa_ySiO_4$:Eu.

In some embodiments others of LED chips 48 can comprise blue emitting LED coated by other phosphors that absorb blue light and emit yellow or green light. Some of the phosphors that can be used for these LED chips include:
Yellow/Green
$(Sr,Ca,Ba)(Al,Ga)_2S_4$:Eu$^{2+}$
$Ba_2(Mg,Zn) Si_2O_7$:Eu$^{2+}$
$Gd_{0.46}Sr_{0.31}Al_{1.23}O_xF_{1.38}$:Eu$^{2+}{}_{0.06}$
$(Ba_{1-x-y}Sr_xCa_y) SiO_4$:Eu
$Ba_2SiO_4$:Eu$^{2+}$ The LED chips 48 emitting red light can comprise LED structures and materials that permit emission of red light directly from the active region. Alternatively, in other embodiments the red emitting LED chips 48 can comprise LEDs covered by a phosphor that absorbs the LED light and emits a red light. Some phosphors appropriate for this structures can comprise:
Red
$Lu_2O_3$:Eu$^{3+}$
$(Sr_{2-x}La_x)(Ce_{1-x}Eu_x)O_4$
$Sr_2Ce_{1-x}Eu_xO_4$
$Sr_{2-x}Eu_xCeO_4$
$SrTiO_3$:Pr$^{3+}$,Ga$^{3+}$
$CaAlSiN_3$:Eu$^{2+}$
$Sr_2Si_5N_8$:Eu$^{2+}$ Each of the phosphors described above exhibits excitation in the desired emission spectrum, provides a desirable peak emission, has efficient light conversion, and has acceptable Stokes shift. It is understood, however, that many other phosphors can used in combination with other LED colors to achieve the desired color of light.

The LED chips 48 can be coated with a phosphor using many different methods, with one suitable method being described in U.S. patent application Ser. Nos. 11/656,759 and 11/899,790, both entitled "Wafer Level Phosphor Coating Method and Devices Fabricated Utilizing Method", and both of which are incorporated herein by reference. Alternatively the LEDs can be coated using other methods such as electrophoretic deposition (EPD), with a suitable EPD method described in U.S. patent application Ser. No. 11/473,089 entitled "Close Loop Electrophoretic Deposition of Semiconductor Devices", which is also incorporated herein by reference. It is understood that LED packages according to the present invention can also have multiple LEDs of different colors, one or more of which may be white emitting.

The die pads 44 and conductive traces 46 can comprise many different materials such as metals or other conductive materials. In one embodiment they can comprise copper deposited using known techniques such as plating and can then be patterned using standard lithographic processes. In other embodiments the layer can be sputtered using a mask to form the desired pattern. In some embodiments according to the present invention some of the conductive features can include only copper, with others of the features including additional materials. For example, the die pads 44 can be plated or coated with additional metals or materials to make them more suitable for mounting of LEDs. In one embodiment the die pads 44 can be plated with adhesive or bonding materials, or reflective and barrier layers. The LEDs can be mounted to the die pads 44 using known methods and materials such as using conventional solder materials that may or may not contain a flux material or dispensed polymeric materials that may be thermally and electrically conductive. The die attach pads can also be mounted directly to the board 42, or intervening layers can be included, such as layers to provide improved adhesion between the attach pads 44 and board. The conductive traces 46 can pass under the die attach pads to enhance electric connection between the two.

The LED component and its array can have many different shapes and sizes, with the LED component 40 having a generally oblong shape to accommodate the first and second wire bond pads 49a, 49b. Other embodiments of the LED component can have different shapes such as circular, oval, square, rectangular or triangular. The LED component 40 is referred to as compact because of its generally small size for this number of LED chips and light output characteristics. In the embodiment shown, the LED component can have a distance across the board (e.g. diameter for circular boards) that is in the range of 5-50 mm. In other embodiments the distance across can be in the range of 10-30 mm. In some embodiments the distance can be approximately 18.5 mm, while in other embodiments it can be approximately 15 mm. In the oblong embodiment shown, the LED component can be approximately 15 mm by 16 mm.

The board 42 can be formed of many different materials that can be arranged to provide the desired electrical isolation and high thermal conductivity. In some embodiments, the board 42 can at least partially comprise a dielectric to provide the desired electrical isolation. In other embodiments the board 42 can comprise ceramic such as alumina, aluminum nitride, silicon carbide, or a polymeric material such as polyimide and polyester etc. For boards made of materials such a polymides and polyesters, the boards can be flexible. This can allow the boards to take a non-planar or three-dimensional shape, with the LED chips also being arranged in a non-planar manner. This can assist in providing boards that emit the different light patterns, with the non-planar shape allowing for a less directional emission pattern. In some embodiments, this arrangement can allow for more omnidirectional emission, such as in the 0-180° emission angles.

In other embodiments the board 42 can comprise highly reflective material, such as reflective ceramic or metal layers like silver, to enhance light extraction from the component. In other embodiments the submount 42 can comprise a printed circuit board (PCB), sapphire, silicon carbide or silicon or any other suitable material, such as T-Clad thermal clad insulated substrate material, available from The Bergquist Company of Chanhassen, Minn. For PCB embodiments different PCB types can be used such as standard FR-4 PCB, metal core PCB, or any other type of printed circuit board. The board can also be fabricated using known prepreg materials and techniques. The size of the submount 42 can vary depending on different factors, with one being the size and number of LED chips 48.

In some embodiments that board 42 can comprise a dielectric layer 50 to provide electrical isolation, while also comprising electrically neutral materials that provide good thermal conductivity. Different dielectric materials can be used for the dielectric layer including epoxy based dielectrics, with different electrically neutral, thermally conductive materials dispersed within it. Many different materials can be used, including but not limited to alumina, aluminum nitride (AlN) boron nitride, diamond, etc. Different boards according to the present invention can provide different levels of electrical isolation with some embodiments providing electrical isolation to breakdown in the range of 100 to 5000 volts. In other embodiments, the board can provide electrical isolation in the range of 1000 to 3000 volts. In still other embodiments, the board can provide electrical isolation of approximately 2000 volts breakdown. The boards according to the present invention can provide different levels of thermal conductivity, with some having a thermal conductivity in the range of 1-40 w/m/k. In other embodiments, the board can have a thermal conductivity of larger than 10 w/m/k. In still other embodiments, the board can have a thermal conductivity of approximately 3.5 W/m-k.

The dielectric layer can have many different thicknesses to provide the desired electrical isolation and thermal conductivity characteristics, such as in the range of 10 to 100 micro meters ($\mu$m). In other embodiments, the dielectric layer can have a thickness in the range of 20 to 50 ($\mu$m). In still other embodiments, the dielectric layer can have a thickness of approximately 35 ($\mu$m).

The board 42 can also comprise a base plate 52 on the dielectric layer 50, opposite the LED array, and can comprise a thermally conductive material to assist in heat spreading. The base plate can comprise different material such as copper, aluminum or aluminum nitride. The base plate can have different thicknesses, such an in the range of 100 to 2000 $\mu$m, while other embodiments can have a thickness in the range of 200 to 1000 $\mu$m. Some embodiments can have thickness of approximately 500 $\mu$m.

In some embodiments, the board 42 can also comprise a solder mounting layer (not shown) on the bottom surface of the base plate 52 that is made of materials that make it compatible for mounting directly to a heat sink, such as by solder reflow. These materials can comprise one or more layers of different metals such as nickel, silver, gold, palladium. In some embodiments, the mounting layer can comprise a layer of nickel and silver, such a nickel having thickness in the range of 2 to 3 $\mu$m and silver in the range of 0.1 to 1.0 $\mu$m. In other embodiments, the mounting layer can comprise other layer stacks such as electroless nickel of approximately 5 $\mu$m, electroless palladium of approximately 0.25 $\mu$m, and immersion gold of approximately 0.15 $\mu$m. Direct soldering of a board to a heat sink can enhance thermal spreading of heat from the board to the heat sink by providing an increased thermal contact area between the two. This can enhance both vertical and horizontal heat transfer. The different boards according to the present invention can provide different levels of thermal characteristics with a junction to backside performance of approximately of approximately 0.4° C./W.

The electrical isolation for the LED chips is not only provided by the isolation characteristics of the board 42, but can also be provided by an offset from the edge of the board. The offset provides a certain distance between the outside edge of the LED array 41 and the edge of the board 42. In some embodiments it can be offset a distance in the range of 0.5 to 5 mm. In still other embodiments it can be offset in the range of 1 to 2 mm. In some embodiments the array is offset from the edge of the board by approximately 1.5 mm. Use of the COB mounting techniques with individual LED chips can still allow for an LED component despite the additional need for a setback. The LED chips can be mounted on an area of the board that takes into account the offset; i.e., the offset results in a smaller board area for the LED chips. In the embodiment shown, the setback results on a board area of approximately 12 mm for the LED chips.

To further enhance thermal management, the die attach pads can be larger than the actual LED chips 48, having an extension portion 56 that extends beyond the LED chip edge. This can allow for the heat from the LED chips to spread into a larger area through the thermally conductive die attach pad, where the heat can then spread into a larger area of the board 42. Different embodiments of the die attach pads can extend beyond the LED chip edge different distances. In some embodiments it can extend a distance in the range of 25 to 500 $\mu$m, while in other embodiments it can extend a distance in the range of 70 to 210 $\mu$m.

Pursuant to another aspect of the present invention, a primary element/lens 55 is included over each of the subgroups of LED chips 48 to provide both environmental and mechanical protection. Each primary lens 55 comprises a material substantially transparent to the light from the LED chips 48 it is covering and each primary lens 55 can also be shaped to provide for an increase in first pass emission from the LED lend. That is, the lens surface is such that light from the LED sub-group strikes the surface of the lens within the critical angle to allow the light to pass out of the lens. The primary lenses can be shaped and arranged so that the majority of light from the LEDs strikes the lens surface within the critical, with a smaller amount of light striking outside the critical. This can reduce the amount of light that is absorbed when reflected back toward absorbing features of the LED component and reduces the amount of light that can be lost to total internal reflection (TIR).

Each of the primary lenses 55 can be in different locations on the top of their respective sub-groups with each of the lenses typically mounted over the center of its subgroup. In some embodiments the lens 55 can be formed in direct contact with the LED chips 48 and the top surface of the board 42 around the LED chips. In other embodiments there may be an intervening material or layer between the LED chips 48 and the sub mount's top surface. Direct contact to the LED chips 48 can provide certain advantages such as improved light extraction and ease of fabricating.

The primary lenses 55 can be formed over the LED chips 48 using different molding techniques and the lens 55 can be many different shapes depending on the desired shape of the light output. One suitable shape as shown is hemispheric, with some examples of alternative shapes being ellipsoid bullet, flat, hex-shaped and square. Many different materials can be used for the lens such as silicones, plastics, epoxies or glass, with a suitable material being compatible with molding processes. Silicone is suitable for molding and provides suitable optical transmission properties. It can also withstand subsequent reflow processes and does not significantly degrade over time. It is understood that the lenses 55 can also be textured to improve light extraction or can contain conversion materials (e.g. phosphors) or scattering particles.

The lenses 55 are shown with no lens material on the top surface of the board 42 between adjacent lenses. In some embodiments and layer of lens material can be left on the top surface of the board 42 for ease of manufacturing, particularly when the lenses are molded in place. This layer of lens material can take many different shapes around to the lenses 55 and can have different thicknesses.

The lens 55 can be formed using other methods, such as dispensing the lens material in liquid form over the LED chips 48, and then curing the lens material. In some embodiments the LED component 40 can comprise meniscus features around each LED chip, although it is understood that the dispense method can also be used without the features. The meniscus features form a meniscus with the lens material as it is dispensed in liquid form over the LED chips, with the meniscus holding the lens material in a substantially dome-shape. The lens material can then be cured, forming each of the lenses 55 over its LED chips 48. This meniscus lens formation method and related meniscus features are described in U.S. patent application Ser. No. 11/398,214, entitled "Uniform Emission LED Package," which is incorporated herein by reference.

The lenses 55 can be sized to completely cover all of the die attach pad 44 for its one of the LED chips 48, or the lenses can cover only portions of the die attach pad 44. The lenses 55 can also cover some of the conductive traces 46 while portions of the conductive traces can be uncovered by the optics. The lenses can also have a size and location such that the wire bond pads 49a, 49b are uncovered by the lenses, while in other embodiments the lenses can cover portions of the bond pads 49a, 49b, while leaving enough of the bond pads uncovered for connection of wires to the bond pads 49a, 49b. The LED component 40 can also comprise a reflective layer on the top surface of the board as described below.

The emission efficiency of the LED components according to the present invention can also be improved by maximizing the distance between adjacent primary lenses to avoid potential optical cross-talk between light emitting from adjacent LED sub-groups. Optical cross-talk can occur when light emitting from one lens passes into another lens. A portion of this light can be reflected within the lens and lost due to absorption or TIR. The further the lenses are apart the less likely that light from one can "cross-talk" or spread into another. Accordingly, the space between adjacent ones of the lenses can be maximized while still keeping the LED chips 48 in a compact arrangement on the board 42 with the desired setback. In different embodiments, the primary lens 55 can have many different sizes, depending at least partially on the size of the LED chips 48. In some embodiments the lens 55 can have a diameter that is greater than 2 mm, while in other embodiments that lens 55 can have a diameter greater than 5 mm. In one embodiment, the lens has a diameter that is approximately 5.5 mm.

Providing LED chips 48 in sub-groups with primary optics can provide additional efficient advantages compared to singular LED chips with primary optics. The greater the numbers of LED chips that can have a periphery emission path, the greater the amount of light that can emit without the danger of cross-talk. That is, the more LED chips at the periphery a greater percentage of light is generated with a path to the edge of the board without passing through an adjacent lens. A combination of maximum distance between adjacent lenses and maximum periphery exposure can result in increased emission efficiency. By having the LED chips arranged at or near the periphery can also assist in thermal spreading by allowing for an efficient path for heat to spread to the board edge.

Different embodiments of the LED components can provide different operating characteristics depending at least partially on the number and type of LED chips. Some embodiments can operate from input power in the 10-30 watt range. Some embodiments operate from input power of greater than 10 W, while other embodiments can operate from input power of greater than 15 W. Some embodiments can provide illumination of greater that 500 lumens while others can provide illumination of greater than 700 lumens. These operating characteristics can be provided while still maintaining the LED chip array within a 12 mm envelope on the board.

The LED components as well as these operating characteristics are scalable such that the LED components according to the present invention can have 3 chips up to 10s or 100s of LED chips. The board would likewise need to be larger and may be constrained by the operating parameters, but the optical and thermal arrangements of the LED chips according to the present invention allow for scalability to these embodiments having larger numbers of LED chips. These different arrangements can utilize input power of as little as 3 to 100s of watts.

It is understood that the LED component 40 as well as the embodiments described below, can have many different features beyond those described herein. For example, different embodiments can comprise features or devices that protect the LED chips from electro-static discharge (ESD) damage. In some embodiments these can comprise ESD protection devices associated with and protecting each of the LED chips or can comprise ESD protection devices associated with and protecting a plurality of LED chips. In some embodiments the ESD protection device can comprise one or more diodes, each of which is arranged adjacent and electrically coupled to the one LED chip, or plurality of LED chips, it is protecting. In some embodiments, the ESD protection devices can comprise Zener diodes.

Additional circuits or electrical components can also be included on the board 42 for providing the desired drive signal or protection to the LED chips 48. These can include many different types of circuits, with one being a current compensation circuit. For LED components having LED chips emitting different colors of light, the LED chips can have different characteristics over time and in response to heat. For example, LED components incorporating both red and blue LEDs can be subject to color instability with different operating temperatures and dimming. This can be due to the different behaviors of red and blue LEDs at different temperature and operating power (current/voltage), as well as different operating characteristics over time. This effect can be mitigated somewhat through the implementation of an active control and compensation system. In some embodiments the control and compensation system can reside on the same circuit board as the LED chips, providing a compact and efficient lighting and compensation system.

Figure 5:
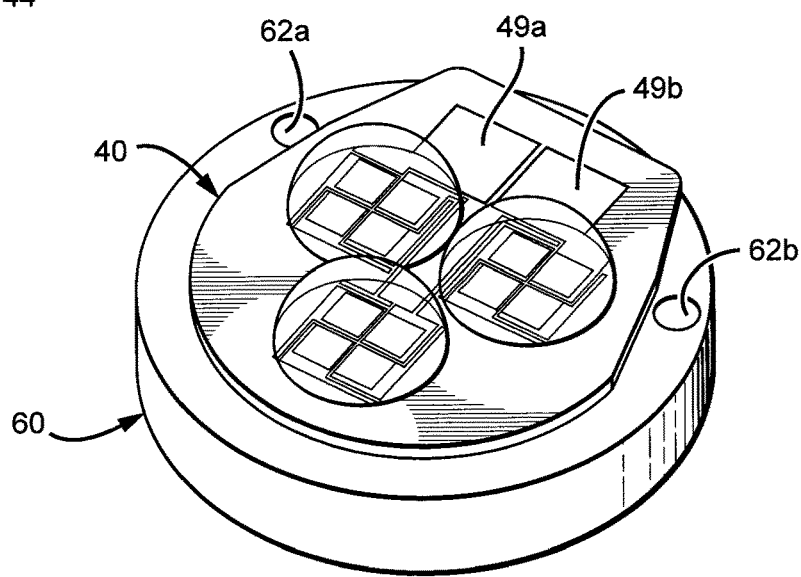
FIG. 5 is a perspective view of the LED component of FIG. 4 mounted to a heat sink.

Referring now to FIG. 5, the LED component 40 can also be mounted to a heat sink 60, such as by a thermal connection between the board 42 and the heat sink 60. As mentioned above, the board 42 can have a layer that is compatible with solder mounting techniques, such as by reflow. The solder between board 42 and the heat sink provides and efficient thermal path to spread heat from the LED chips, with the board's dielectric layer providing the desired electrical isolation. The heat sink can comprise first and second wire holes 62a, 62b that allow wires (not shown) to pass through from the backside of the heat sink for bonding to the first and second wire bond pads 49a, 49b.

Figure 6:
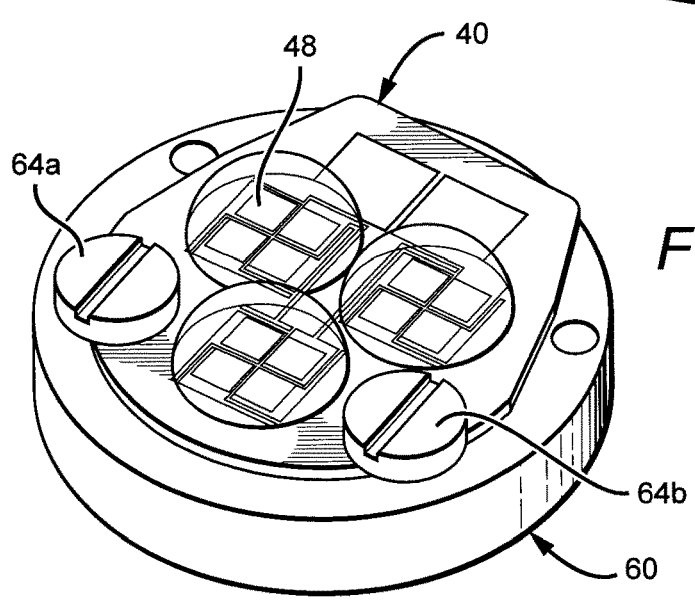
FIG. 6 is a perspective view of the LED component of FIG. 4 mounted to a heat sink.

LED components according to the present invention can also be mounted to heat sink using mechanical means such as screws, rivets, brackets, twist locks, etc. FIG. 6 shows the LED component 40 mounted to a heat sink 60 by first and second screws 64a, 64b. In the embodiment shown utilizes industry designated M2 screws, and pursuant to some current standards, M2 screws can be used that are the smallest screw used in LED lighting applications. Accordingly, the LED chips must be arranged to provide space to accommodate the screw and its head. Clustering the LED chips 48 in sub-groups can help provide unused areas of the board 42 between the sub-groups for the screw heads. The screws 64a, 64b along with the contact between the LED component and the heat sink provide the thermally conductive paths to spread heat from the LED chips into the heat sink.

Figure 7:
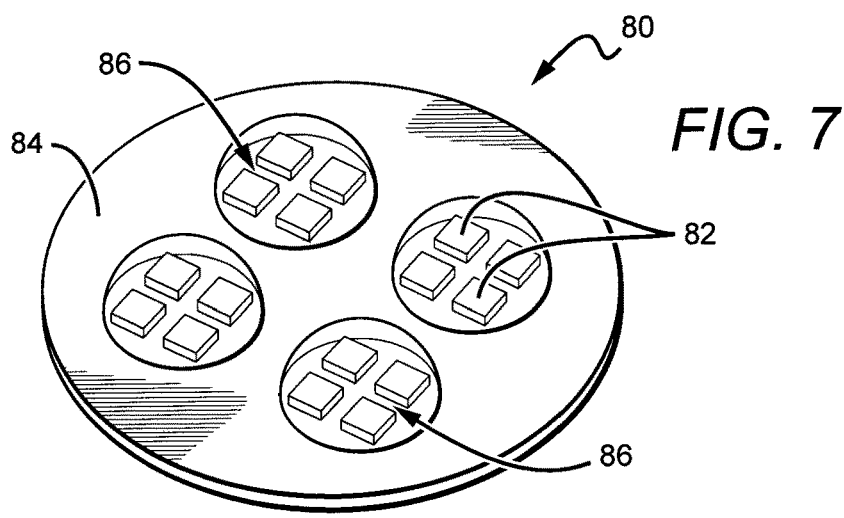
FIG. 7 is a perspective view of another embodiment of an LED component according to the present invention having an array of LED chips in sub-groups.

As mentioned above, different embodiments of LED components according to the present invention can have different numbers of LED chips arranged in different ways. FIG. 7 shows another embodiment of an LED component 80 according to the present invention that is similar to the LED component 40 described above. The LED component 80 comprises 16 LED chips 82 mounted to a board 84 with the LEDs chips 82 and board being similar to those described above. In this embodiment, the LED chips 82 can be clustered in four sub-groups 86 of four LED chips. The LED chips 82 can be interconnected by wire traces in different serial and parallel arrangements. This is only one of the many alternative ways that LED chips can be arranged in sub-groups according to the present invention.

As also mentioned above, the LED components can be arranged with individual LED chips, each of which has its own primary optic or lens, In still other embodiments LED components can be provided having different combinations of single and clustered LED chips each of which has its own primary lens.

FIGS. 8 through 13 show another embodiment of an LED component 100 according to the present invention having 12 LED chips 102 mounted to a board 104 using COB techniques as described above. The LED chips 102 and board 104 can have many of the same or similar features of the LED chips and boards described above. In particular the board 104 can have the same electrical isolation and thermal conductivity characteristics of the board 42 described above.

In this embodiment the LED chips 102 are not clustered in sub-groups, but are instead provided as individual LED chips each having their own primary lens 106. Similar to the embodiment above, the LED chips 102 are mounted on die attach pads and interconnected by conductive traces. Lenses 106 can have many different shapes and sizes as described above, but are preferably hemispheric shaped. The lenses 106 can all be the same size or can comprise different sizes. In some embodiments, the lenses can have a diameter that is greater than 1 mm, while in other embodiments they can have a diameter greater than 2 mm. In one embodiment, the lenses can have a diameter of approximately 2.55 mm. As above, the LED chips and their lenses should have maximum distance between adjacent ones for improved thermal management and reduced optical cross-talk.

Figure 8:
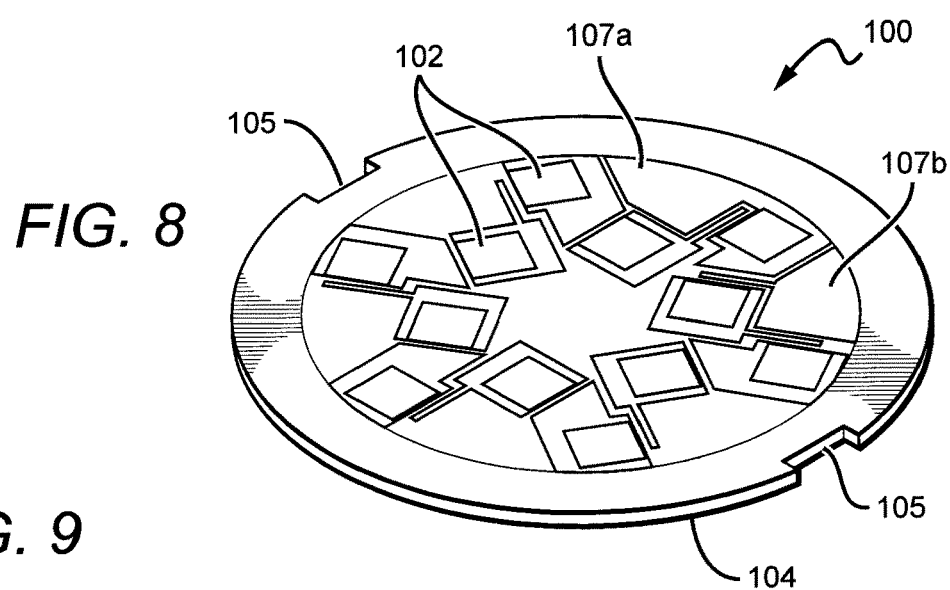
FIG. 8 is a perspective view of another embodiment of an LED component according to the present invention.
Figure 9:
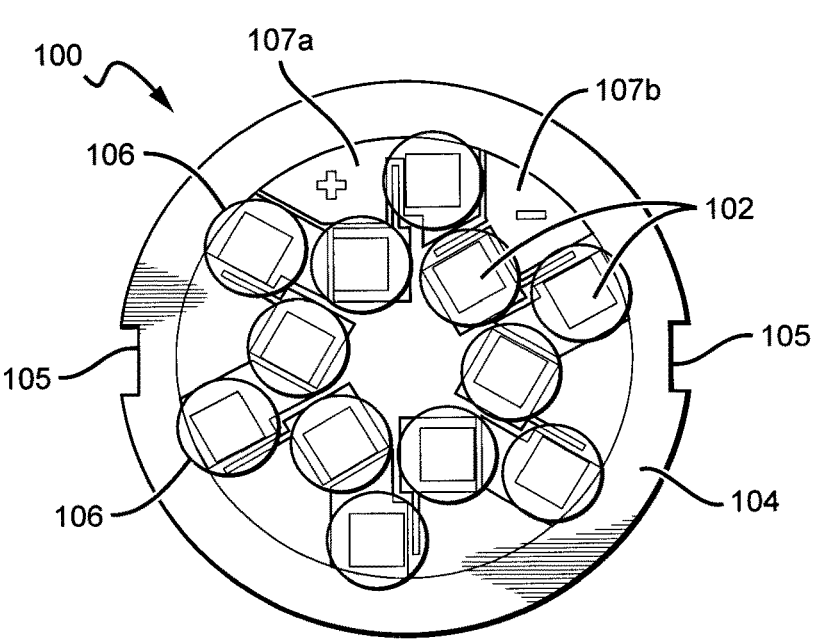
FIG. 9 is top view of the LED component shown in FIG. 8.
Figure 10:
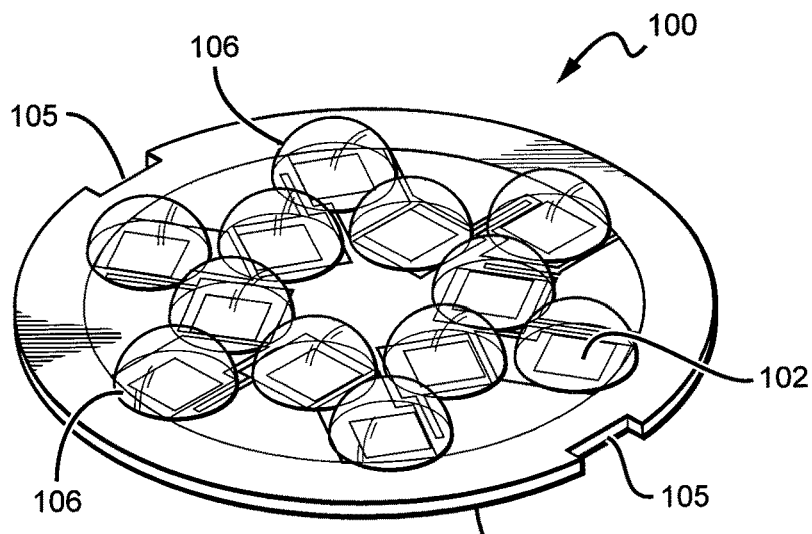
FIG. 10 is a perspective view of the LED component shown in FIG. 8 with primary lenses over the LED chips.
Figure 11:
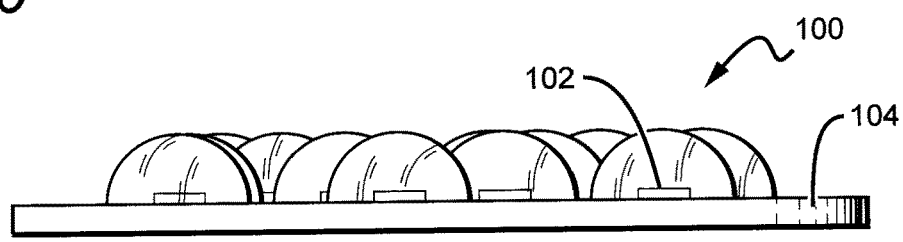
FIG. 11 is a side view of one embodiment of an LED component according to the present invention without the LED chips visible through the primary lenses.
Figure 12:
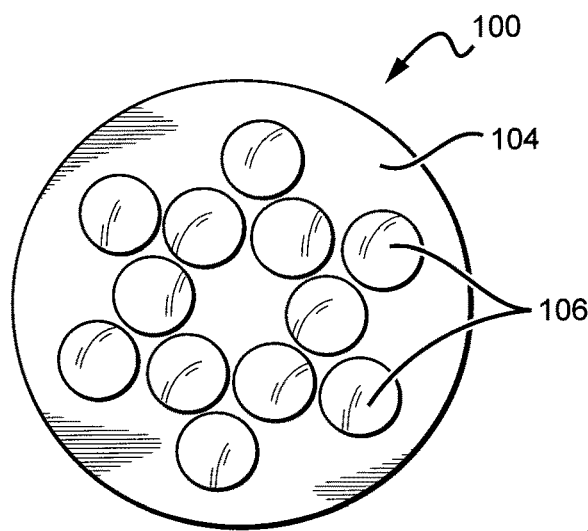
FIG. 12 is a top view of the LED component shown in FIG. 11.
Figure 13:
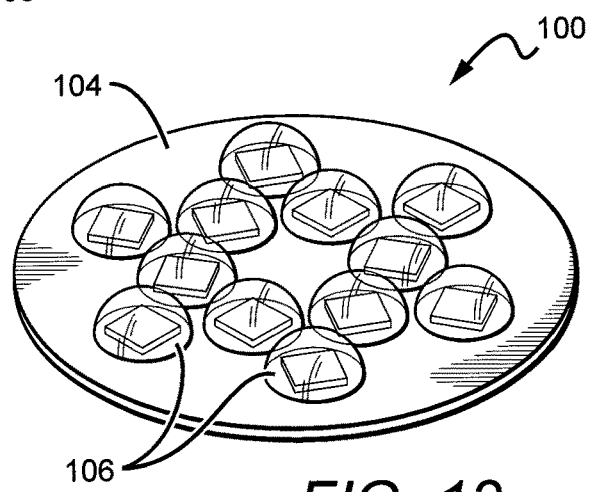
FIG. 13 is perspective view of the LED component shown in FIG. 11.

The LED chips 102 can be provided in different patterns to maximize the distances while still providing the desired operating characteristics. In the embodiment shown the LED chips 102 are provided in a pattern of two concentric circles of LED chips, which can help maximize the distance between adjacent LED chips. The LED chips can be interconnected in different series and parallel arrangements as described above, with the embodiment shown being interconnected in a zig-zag pattern as best shown in FIGS. 8 and 9. First and second wire bond pads 107a, 107b can be included on the board to allow an electrical signal to be applied to the board that spreads to each of the LED chips through the conductive traces and die attach pads as described above. The die attach pads can also have extension sections that extend beyond the edge of the LED chip to improve heat spreading from the LED chip as described above.

The zig-zag pattern of the LED chips 102 also allows for the board to remain "compact" by fitting the LED chips into a relatively small board area. In the embodiment shown, the board 104 is shown as circular, but it is understood that the board can have many different shapes. Like the embodiment above, the LED chips 102 can have a setback from the edge of the board to provide the desired electrical isolation. In some embodiments it can be offset a distance in the range of 0.5 to 5 mm. In still other embodiments it can be offset in the range of 1 to 2 mm. In some embodiments the array is offset from the edge of the board by approximately 1.5 mm. In the embodiment shown, the LED component is circular and can have a diameter that is in the range of 5-50 mm. In other embodiments the diameter can be in the range of 10-30 mm, In the embodiment shown the LED component can have a diameter of approximately 15 mm, with the electric isolation offset providing an area or envelope on the board of approximately 12 mm for the LED chips.

The zig-zag arrangement with concentric circles not only allows for compact placement of the LED chips 102 on the board 104, it can also allow for an increase in LED light that can emit to the periphery of the board without encountering or passing through the lens of an adjacent LED chip. In the embodiment shown, the LED chips of the outer circle are staggered to the LED chips in the inner circle such that each of the outer circle LED chips is adjacent the space between LED chips in the inner circle. This can increase the amount of light from the inner circle LED chips that can pass to the board periphery between the LED chips in the outer circle.

The board 104 can also have one or more cutouts or notches 105 on its edge that are sized to allow wires to pass from one side of the board 104 to the opposite side. In the embodiment shown, the board 104 has two notches 105 on opposing sides of the board, so that two wires can pass from the backside to the top of the board, where the wires can be connected to the wire bond pads 107a, 107b. This allows from an electrical signal to pass from the backside to the front side of the board 104, to be applied to the bond pads for driving the LED chips 102.

Figure 14:
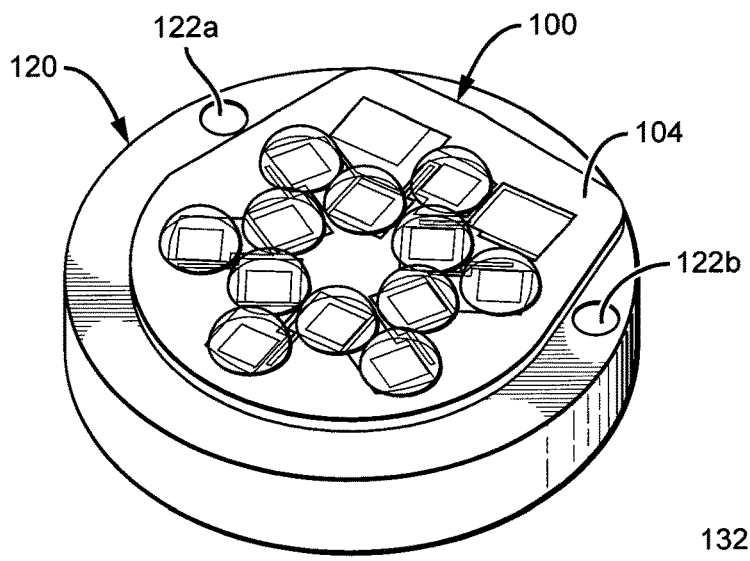
FIG. 14 is a perspective view of another embodiment of an LED component according to the present invention mounted to a heat sink.

Referring now to FIG. 14, the LED component 100 can mounted to a heat sink 120 to help spread heat from the LED chips 102. Like the embodiment discussed above, the board 104 can have a layer that is compatible with solder reflow techniques. The solder between board 104 and the heat sink 120 provides an efficient thermal path to spread heat from the LED chips, with the board's dielectric layer providing the desired electrical isolation. Soldering also allows for mounting of the board without using areas of the board for mechanical mounting means, which can help the board remain more compact. The heat sink 120 can comprise first and second wire holes 122a, 122b that allow wires (not shown) to pass through from the backside of the heat sink for bonding to the first and second contacts wire bond pads. As mentioned above, the LED components according to the present invention can take many different shapes and sizes, with the LED component being oblong and having a size of approximately 15 mm by 16 mm.

Figure 15:
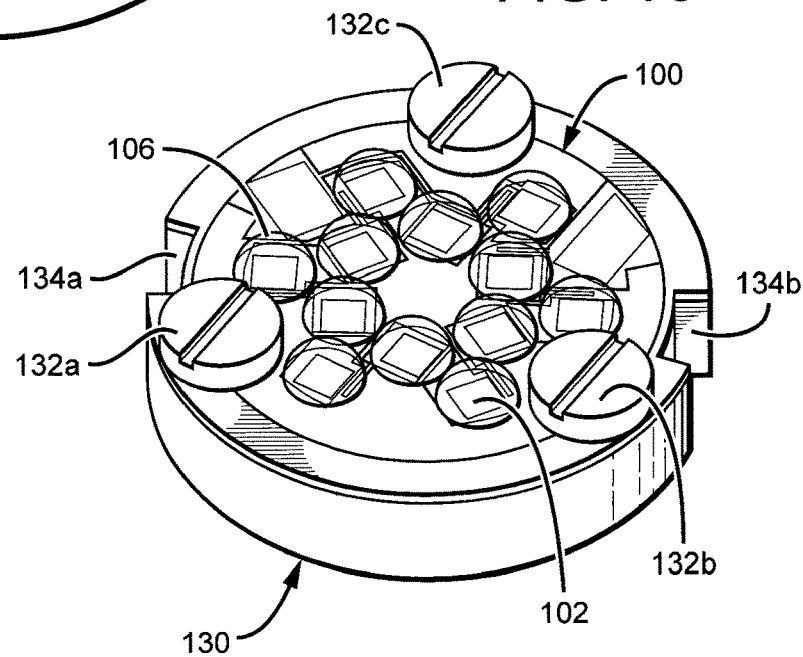
FIG. 15 is a perspective view of another embodiment of an LED component according to the present invention mounted to a heat sink.

Like the embodiment above, the LED component 100 can also be mounted to heat sink using mechanical means such as screws, rivets, brackets, twist locks, etc. FIG. 15 shows the LED component 100 mounted to a heat sink 130 by first, second and third mounting screws 132a, 132b, 132c. The mounting screws can be many different shapes and sizes, with the embodiment shown using industry standard M2 screws. Accordingly, the LED chips 102 and their primary lenses must be arranged to provide space to accommodate the screw and its head. Arranging the LED chips in the inside and outside circles, space is provided between the LED chips in the outside circle. Different numbers of screws can be used, with the embodiment shown having three mounting screws 132a, 132b, 132c spaced approximately 120° apart. Notwithstanding the spacing of the LED chips 102, the LED component 100 used with mechanical mounts may need to be larger to accommodate the screw heads. In the embodiment shown, the LED component 100 can have a diameter greater than approximately 18 mm and in some embodiments can have a diameter of approximately 18.5 mm. The screws 132a, 132b, 132c along with the heat contact/radiation between the LED component and the heat sink provide the thermally conductive paths to spread heat from the LED chips into the heat sink. The LED component can also have first and second side slots 134a, 134b to allows wires to pass for attachment to the first and second wire bond pads.

Figure 16:
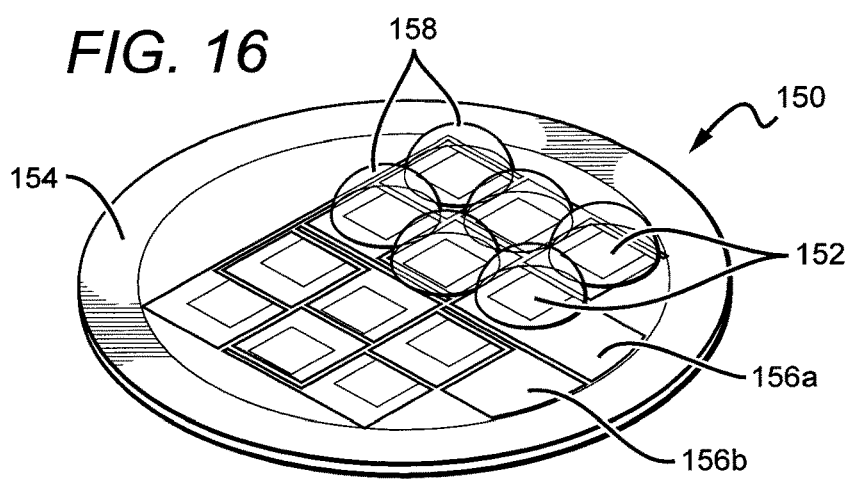
FIG. 16 is a perspective view of another embodiment of an LED component according to the present invention.

FIGS. 16 and 17 show another embodiment of an LED component 150 having an array of LED chips 152 arranged in a rectangular formation on a board 154. The board 154 can have the same characteristics as the board's above and in particular the thermal and electrical characteristics. The LED chips 152 can be mounted on the board 154 using COB techniques and can be connected in series between first and second wire bond pads 156a, 156b such that when an electrical signal is applied to the contacts 156a, 156b, the LED chips emit light. Like LED component 100 described above, each of the LED chips 152 has its own primary lens 158 that is preferably hemispheric shaped and arranged to promote first pass LED chip emission from the lens. This arrangement is more compact, but fewer of the LEDs can emit to the board periphery without encountering another of the primary lenses. The LED chips are also arranged in closer proximity such that they may experience reduced emission efficiency based on increased optical cross-talk and may experience increased operating temperature. Like the embodiments above, the LED component 150 can be mounted to a heat sink using solder or other mechanical mounting techniques.

FIG. 18 shows the emission characteristic for some embodiments of an LED component according to the present invention based on normalized intensity verses viewing angle. The emission intensity of the LED components can be the greatest and a 0 degrees viewing angle and can drop off at increasing viewing angles to nominal emission at angles greater approximately 95 degrees. The beam profile shows has the advantage of being broader than Lambertian (cosine) emission characteristics.

Figure 19:
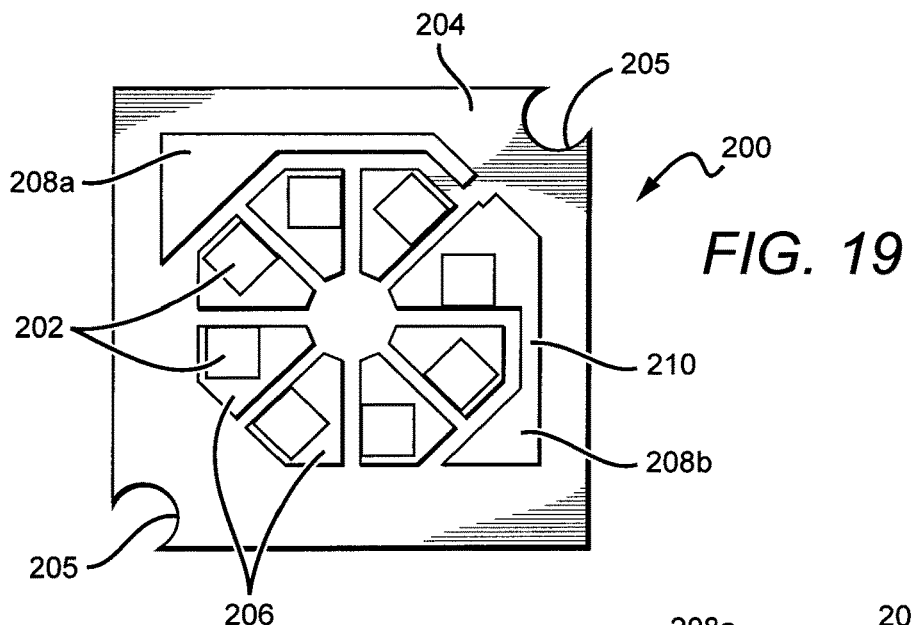
FIG. 19 is a top view of another embodiment of an LED component according to the present invention.
Figure 20:
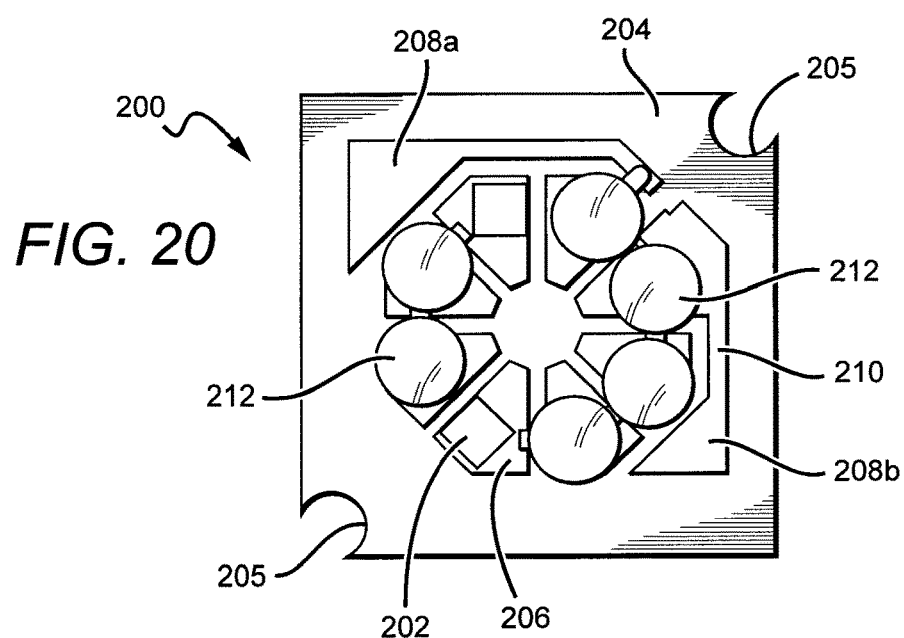
FIG. 20 is a top view of the LED component in FIG. 19 with primary optics over some of the LED chips.
Figure 21:
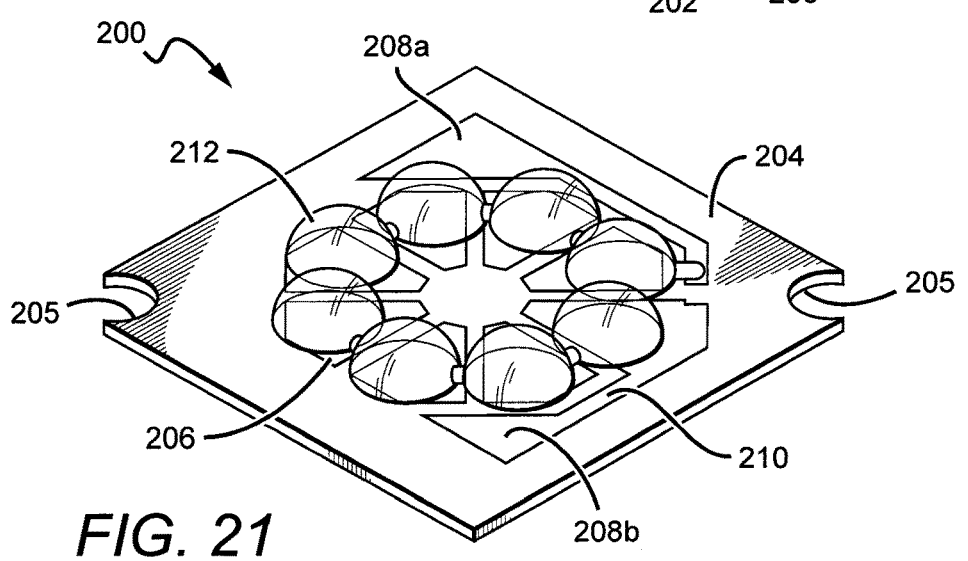
FIG. 21 is a perspective view of the LED component in FIG. 19 with primary optics over all of the LED chips.

As mentioned above, the LED components according to the present invention can have many different numbers of LED chips and furthermore, the boards' used in the different embodiments can have different shapes and sizes. FIGS. 19 through 21 show another embodiment of and LED component 200 according to the present invention having eight LED chips 202 mounted on a generally square or rectangular shaped board 204, also using COB techniques. The LED chips 202 can be mounted to die attach pads 206 interconnected in series between first and second wire bond pads 208a, 208b by conductive traces 210. The board 204 can also comprise notches 205, sized to allow wires to pass from one side of the board 204 to the other. It is understood that the LED chips can also be arranged in different series and parallel interconnection arrangements.

The LED chips 202 are positioned in a circle to provide an unobstructed path to the periphery of the board for each of the LED chips and to provide improved heat spreading to the edge of the board. Each of the LED chips 202 also has its own primary lens 212 to enhance first pass light extraction as described above, with the lenses preferably being hemispheric shaped. The board 204 can have many of the same electrical and thermal characteristics as the boards discussed above, but because of the reduced number of LED chips 202, the board 204 can be smaller. Some embodiments can have sides greater than 10 mm, while other embodiments can have sides greater than 12 mm. In the embodiment shown, the board can be 13.5 mm by 12.15 mm.

The die attach pads 206 can be arranged to hold different sized LED chips, with the embodiment shown arranged to accommodate 1.4 mm sized LED chips. The die attach pads 206 also extend beyond the LED chip edges to facilitate heat spreading, with the die attach pads 206 shown extending from three edges of the LED chip, with one edge extending to the center of the board.

Figure 22:
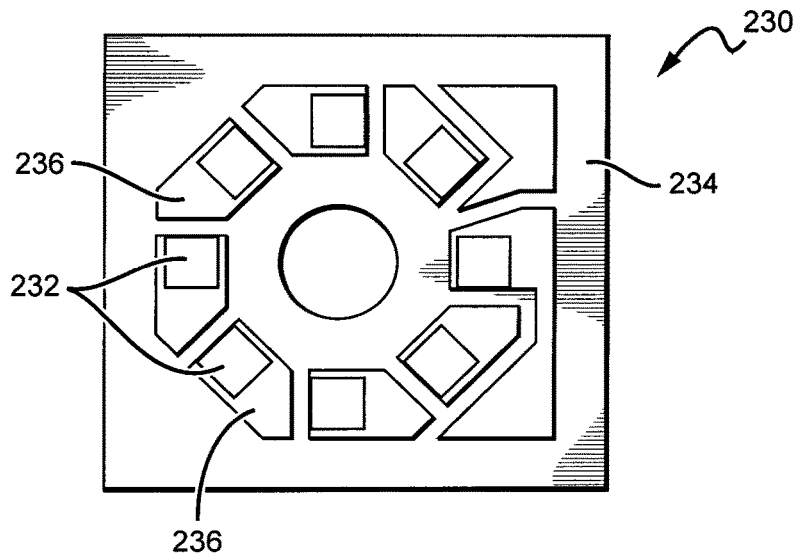
FIG. 22 is a top view of another embodiment of an LED component according to the present invention.

FIG. 22 shows still another embodiment of an LED component 230 according to the present invention that is similar to the LED component 200 and comprises LED chips 232 mounted to board 234, also using COB techniques. The LED chips are mounted on die attach pads 236 that also extend beyond the edges of the LED chips in a somewhat different shape. The majority die attach extension runs closer to the periphery of the board, which can enhance heat spreading toward the edge where it can dissipate into the ambient. It is understood that the eight LED chip arrangements shown in FIGS. 19 through 22 can also be mounted to a heat sink as described above using either solder reflow or mechanical components.

Figure 23:
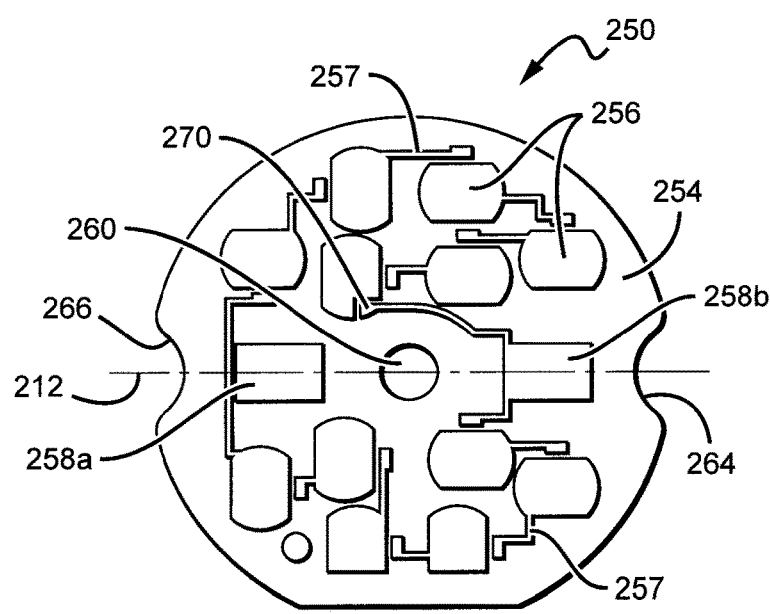
FIG. 23 is a top view of another embodiment of an LED component according to the present invention.

FIGS. 23-27 show components and features of still another embodiment of an LED component 250 according to the present invention that is similar to the LED components described above and comprises LED chips 252 mounted to board 254, also using COB techniques. The LED chips 252 and board 254 can be made of the materials described above and can have the different features as the LED chips and boards described above. There can be different numbers of LED chips in different embodiments according to the present invention, with the embodiment shown having twelve (12) LED chips 252. As best shown in FIG. 23, the component 250 also comprises die attach pads 256 and interconnect traces 257 formed on the board 254. Each of the die attach pads is sized so that one of the LED chips 252 can be mounted to a respective one of the die attach pads. First and second wire bond pads 258a, 258b are also included on the board 254, such that when the LED chips 252 are mounted on the die attach pads 256 they are connected in series between the bond pads 258a, 258b by the interconnect traces 257. It is understood that the LED chips can also be coupled in parallel between the bond pads 258a, 258b, or can be coupled between the bond pads in different series and parallel combinations as described above. The board 254 also has a mounting hole 260 for mounting the LED component 250 in a fixture, such as by a screw (not shown).

In this embodiment, the bond pads 258a, 258b are located on a diameter line or equator 262 of the board 254, with the mounting hole 260 between the bond pads 258a, 258b. The LED chips 252 are not found along the equator 262, but clustered above and below the equator 262, with half of the LED chips being above, and half of the LED chips being below. It is understood that different numbers of chips can be above and below in the same or different numbers, with the embodiment shown having six LED chips 252 above and six below the equator 262. Notches 264 for wires to pass are included on opposite sides of the board 254, with each one being adjacent to a respective one of the bond pads 258a, 258b. This arrangement provides for a shorter distance between the notches 264 and the bond pads 258a, 258b that allows for a wire to pass from the notch 264 to its particular one of the bond pads 258a, 258b in a straight line and at a short distance. This can provide the advantage of easier manufacturing and a more reliable wire bonding.

Figure 25:
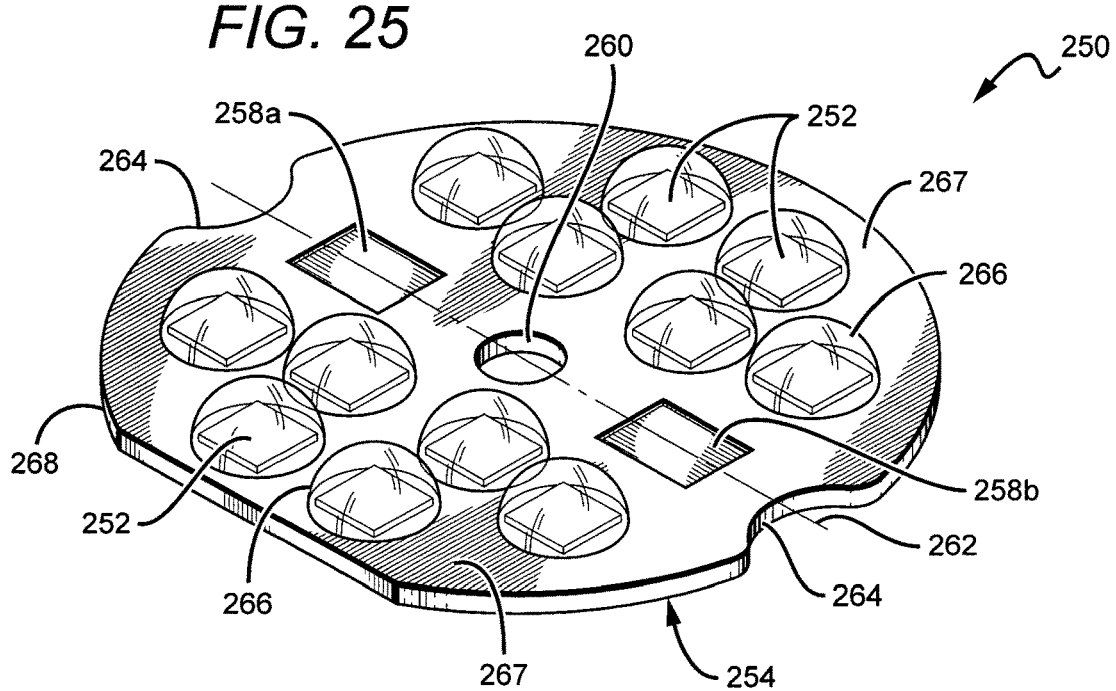
FIG. 25 is a perspective view of another embodiment of an LED component according to the present invention.
Figure 26:
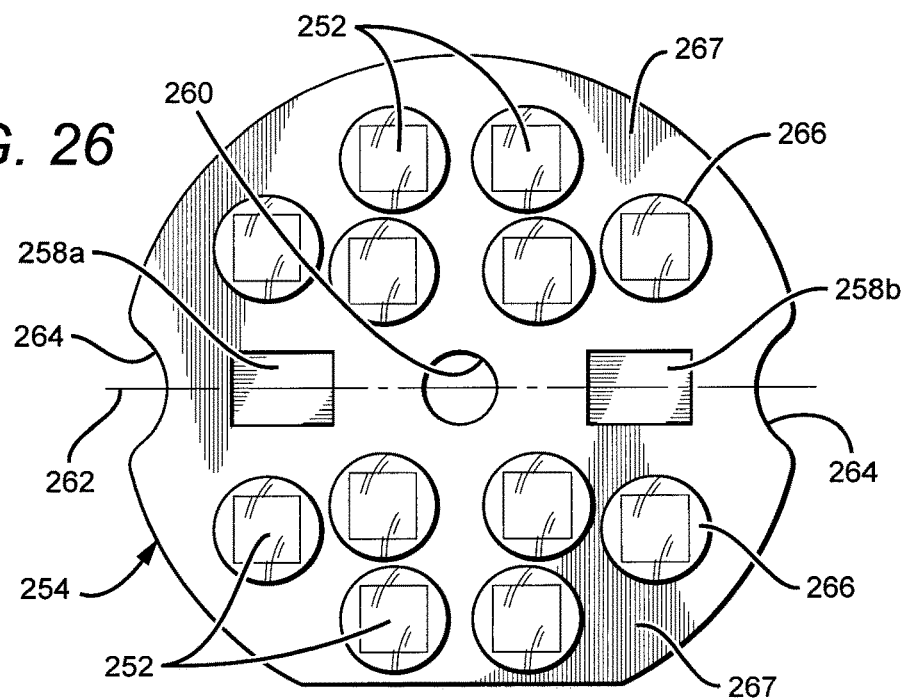
FIG. 26 is a top view of the LED component shown in FIG. 25.
Figure 27:
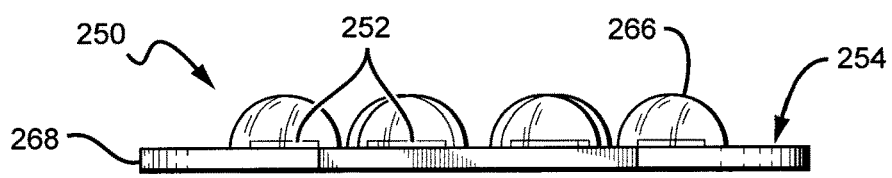
FIG. 27 is a side view of the LED component shown in FIG. 25.

As best shown in FIGS. 25 through 27, each of the LED chips 252 also has its own primary lens 266 that can be formed using the methods described above. The lens 266 should be sized to cover its one of the LED chips 252 and to provide the desired light extraction. In some embodiments, the lenses can have a diameter of greater than 2 mm, while in other embodiments it can have a diameter of greater than 3 mm. In some embodiments it can have a diameter of approximately 3.1 mm. The LED chip and lens arrangement can provide for light extraction of greater than 90%, with some embodiments having light extraction of greater than 96%. FIGS. 25 and 26 show a layer of lens material 267 between and around the lenses 266, with the layer 267 being left behind as the result of lens fabrication process, such as molding. As mentioned above, this layer of lens material can take many different shapes and thicknesses. In some embodiments, all or some of the lenses can be provided without the surrounding layer of lens material.

Figure 24:
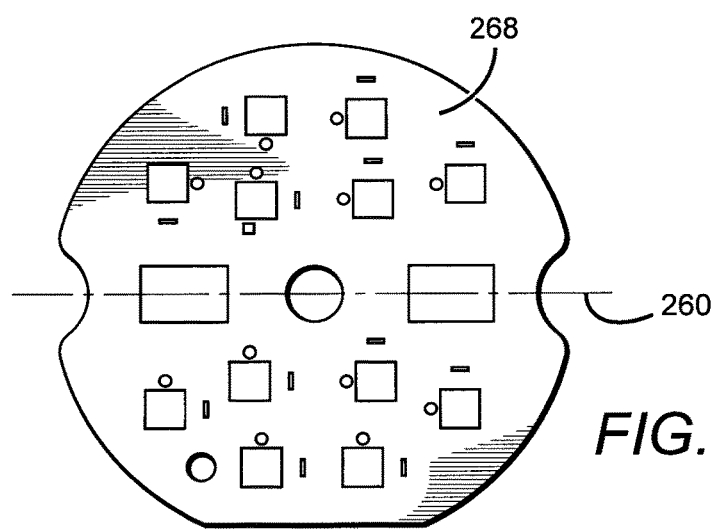
FIG. 24 is a top view of a reflective layer that can be used on LED components according to the present invention.

Referring now to FIG. 24, the LED component 250 can further comprise a reflective layer 268 that is shown as a separate layer in FIG. 24, but is formed or placed on the top surface of the board 254 as shown in FIGS. 25 and 27. The reflective layer 268 covers most of the top surface of the board 254. This can include portions of the die attach pads 256, portions of the bond pads 258a, 258b and the interconnect traces 257 shown in FIG. 23. In the LED component as shown in FIGS. 25-27, the die attach pads and interconnect traces are covered by the reflective layer 268 and LED chips 252 are most are not visible. The bond pads 258a, 258b are visible through openings in the reflective layer 268. The reflective layer 268 covers many of the light absorption surfaces with a reflective surface that reflects LED chip light emitted back towards the board 254 so that it can contribute to the LED components useful emission.

The reflective layer 268 can comprise different reflective materials formed or deposited using known methods. In some embodiments, the reflective layer can comprise submicron or nanometer sized particles held in a binding material. In some embodiments, the reflective layer 268 can comprise submicron or nanometer sized titanium particles in a polymer binder, such as silicone. More than one scattering material in various combinations of materials or combinations of different forms of the same material may be used to achieve a particular scattering effect. Different reflective layers can have different reflectivity, with some embodiments having a reflectivity of greater than 85%, while others have a reflectivity of greater than 95%.

The reflective layer 268 can be included as part of a solder mask, or it can be a separate layer formed on the board 254. It can be included on LED components with or without solder masks. It is also understood that a reflectivity layer and solder mask layer can be included in any of the embodiments shown in the figures and discussed above.

In the embodiment shown, the reflective layer covers the majority of the board's top surface, except the areas where the LEDs chips 252 are attached to the attach pads 256, and where the wires are attached to wire bond pads 258a, 258b. In some embodiments, there can be a gap between the edge of one or more of the LED chips 252 and the reflective layer 268, with a portion attach pad exposed between LED chips 252 and reflective layer 268. Similarly, a portion of the bond pads 258a, 258b can be exposed following wire bonding. To reduce the absorption of light that can occur on these exposed portions of the attach pads and bond pads, they covered by reflective material such a reflective metal.

In different embodiments, the reflective layer 268 can pass under the primary lenses 266, while in other embodiments it can be outside of the lenses 266. The LED component 250 can also comprise a dielectric layer to provide electrical isolation and a heat sink as described above. Different embodiments can also comprise on-board ESD protection components and circuits as described above, as well as other types of on-board circuits such as current compensation circuits as described above. In LED component 250, an ESD protection chip can be included on ESD attach pad 270 (shown in FIG. 23), and can be coupled to the LED chip circuit to provide ESD protection.

Figure 28:
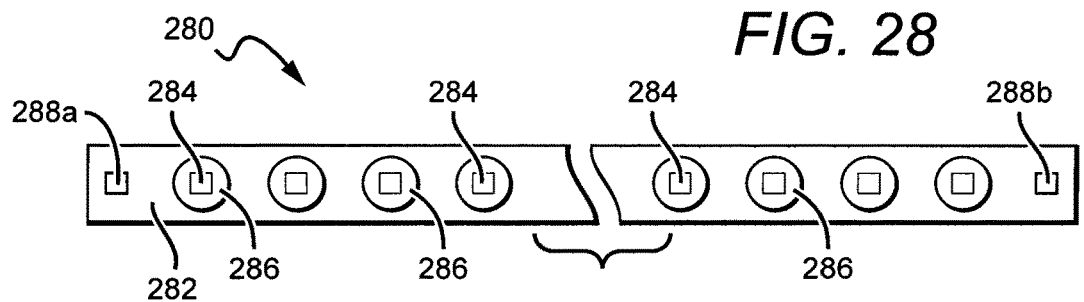
FIG. 28 is a top view of another embodiment of an LED component according to the present invention.

It is understood that the LED components according to the present invention can take many different shapes beyond those described above, including but not limited to triangular, oval, rectangular, linear, etc. FIG. 28 shows one embodiment of linearly arranged LED component 280 comprising an elongated circuit board 282, with LED chips 284 and primary lenses 286 formed over the LED chips 284 using the methods described above. Wire bond pads 288a, 288b are included at the ends of the board 282, but it is understood that they could be placed in many different locations. The LED component 280 can comprise the features described above, including but not limited to, a dielectric layer, a reflective layer, an ESD protection device, and current compensation circuit. The component 280 can comprise a compact linear array of LED chips 284 that can be different lengths, from centimeters to meters long. The LED component can be arranged at a length compatible with conventional fluorescent lamps, with the LED components be arranged as replacement bulbs for fluorescent lamps.

Figure 29:
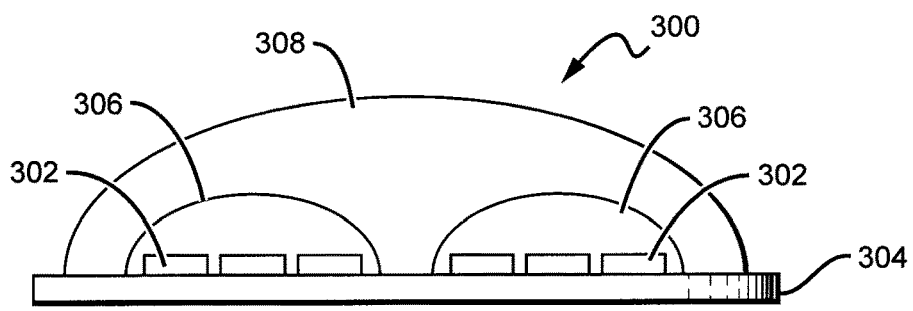
FIG. 29 is a side view of another embodiment of an LED component according to the present invention comprising secondary lens/optic.
Figure 30:
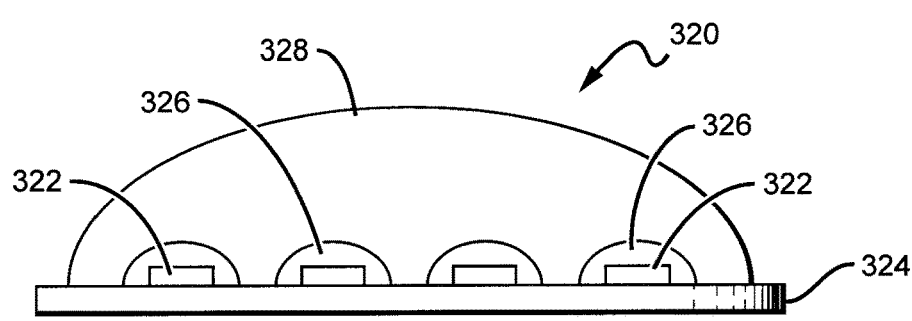
FIG. 30 is a side view of another embodiment of an LED component according to the present invention comprising secondary lens/optic.
Figure 31:
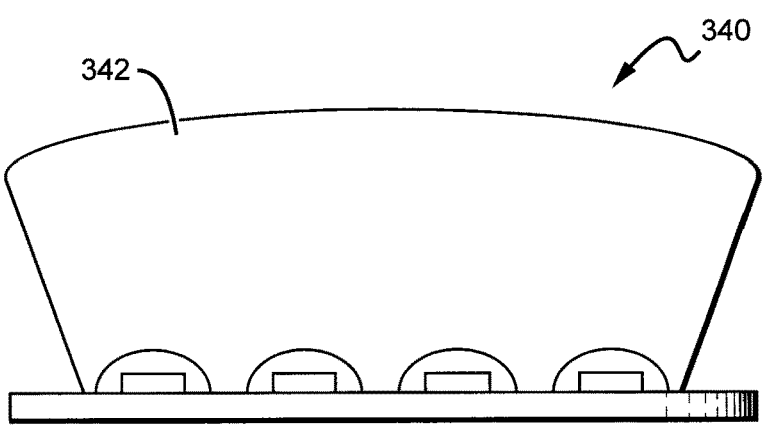
FIG. 31 is a side view of still another embodiment of an LED component according to the present invention comprising secondary lens/optics.

Different embodiments of the present invention can also be provided with secondary optics over all or some of the primary optics to provide for protection for the LED array and/or to provide for beam shaping from the LED array. The secondary optics can take many different shapes and sizes and can have additional conversion or scattering materials. FIG. 29 shows one embodiment of an LED component 300 with sub-groups of LED chips 302 mounted to a board 304 as described above. Each of the sub-groups can have its own primary lens 306, with the primary lens then covered by a hemispheric shaped secondary lens 308. FIG. 30 shows another embodiment of and LED component 320 according to the present invention also having an array of LED chips 322 on a board 324. In this embodiment each of the LED chips has its own primary lens 326 that is covered by a hemispheric shaped secondary lens 328. FIG. 31 shows still another embodiment of an LED component 340 according to the present invention that is similar to the LED component 320 but comprises a secondary optic 342 having a shape other hemispheric. It is understood that these are only some of the different shapes for the secondary optics in LED components according to the present invention.

Although the present invention has been described in detail with reference to certain preferred configurations thereof, other versions are possible. Therefore, the spirit and scope of the invention should not be limited to the versions described above.

We claim:

1. An LED component, comprising:
   a circuit board with an array of LED chips thereon and electrically interconnected, wherein said circuit board comprises a dielectric with one or more thermally conductive materials;
   at least two bond pads on said circuit board configured to conduct an electrical signal to said plurality of LED chips, said at least two bond pads adjacent to one another, each of said bond pads comprising a surface area greater than 3 mm²;
   a plurality of primary lenses, each of which is formed directly over a sub-group of said LED chips; and
   a heat sink having a diameter greater than that of said circuit board, said circuit board on said heat sink so that heat from said LED chips spreads into said heat sink, wherein said heat sink comprises notches or holes for accommodating wire pass through.

2. The LED component of claim 1, wherein said circuit board is thermally conductive.

3. The LED component of claim 1, wherein said circuit board is electrically insulating.

4. The LED component of claim 1, wherein said circuit board comprises a layer and/or layers of material compatible with soldering.

5. The LED component of claim 1, wherein said circuit board is soldered to said heat sink.

6. The LED component of claim 1, wherein said circuit board is mechanically mounted to said heat sink.

7. The LED component of claim 1, wherein said circuit board further comprises a reflective layer.

8. An LED component, comprising:
   a circuit board comprising an associated perimeter, wherein said circuit board comprises a dielectric with one or more thermally conductive materials;
   a plurality of LED chips on said circuit board;
   at least two primary optics, each primary optic over a subgroup of said LED chips; and
   a secondary optic over said at least two primary optics, wherein said secondary optic is in contact with each of said primary optics;
   wherein a bottom of said secondary optic, a bottom of each of said primary optics, and a bottom of each of said plurality of LED chips are all substantially coplanar and do not extend to the perimeter of said circuit board.

9. The LED component of claim 8, wherein each of said primary optics is directly on its respective subgroup of said LED chips.

10. The LED component of claim 8, wherein said secondary optic is directly on said primary optics.

11. The LED component of claim 8, wherein said secondary optic provides for beam shaping of light from said LED chips.

12. The LED component of claim 8, wherein said secondary optic comprises conversion or scattering materials.

13. The LED component of claim 8, wherein said secondary optic is hemispheric shaped.

14. The LED component of claim 8, wherein each of said plurality of LED chips is chip-on-board mounted on said circuit board.

15. An LED component, comprising:
   a circuit board comprising an associated perimeter, wherein said circuit board comprises a dielectric with one or more thermally conductive materials;
   a plurality of LED chips on said circuit board;
   a plurality of primary optics, each of which is over two or more of said LED chips; and
   a secondary optic over and in contact with said primary optics, wherein said secondary optic comprises a different shape than at least one of said primary optics;
   wherein a bottom of each of said plurality of LED chips, a bottom of each of said plurality of said primary optics, and a bottom of said secondary optic are all substantially coplanar and do not extend to the perimeter of said circuit board.

16. The LED component of claim 15, wherein each of said plurality of primary optics is hemispheric and said secondary optic is non-hemispheric.

* * * * *